United States Patent
Khakifirooz et al.

(10) Patent No.: US 8,809,920 B2
(45) Date of Patent: Aug. 19, 2014

(54) PREVENTION OF FIN EROSION FOR SEMICONDUCTOR DEVICES

(71) Applicants: International Business Machines Corporation, Armonk, NY (US); GlobalFoundries Inc., Grand Cayman (KY)

(72) Inventors: Ali Khakifirooz, Slingerlands, NY (US); Thomas N. Adam, Slingerlands, NY (US); Kangguo Cheng, Guilderland, NY (US); Shom Ponoth, Clifton Park, NY (US); Alexander Reznicek, Troy, NY (US); Raghavasimhan Sreenivasan, Schenectady, NY (US); Xiuyu Cai, Niskayuna, NY (US); Ruilong Xie, Niskayuna, NY (US)

(73) Assignees: International Business Machines Corporation, Armonk, NY (US); Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/670,674

(22) Filed: Nov. 7, 2012

(65) Prior Publication Data
US 2014/0124840 A1 May 8, 2014

(51) Int. Cl.
*H01L 29/76* (2006.01)
(52) U.S. Cl.
USPC .......................... 257/288; 257/213; 257/329
(58) Field of Classification Search
USPC .......................... 257/213, 288, 329
See application file for complete search history.

(56) References Cited

U.S. PATENT DOCUMENTS

| | | | |
|---|---|---|---|
| 7,847,323 B2 | 12/2010 | Cheng et al. | |
| 7,872,303 B2 * | 1/2011 | Chan et al. | 257/329 |
| 7,977,174 B2 | 7/2011 | Luning et al. | |
| 7,993,989 B2 | 8/2011 | Anderson et al. | |
| 8,268,727 B2 | 9/2012 | Johnson et al. | |
| 2006/0154423 A1 | 7/2006 | Fried et al. | |
| 2006/0177977 A1 | 8/2006 | Chan et al. | |
| 2006/0292765 A1 * | 12/2006 | Blanchard et al. | 438/157 |
| 2010/0267237 A1 | 10/2010 | Bonser et al. | |
| 2011/0101455 A1 | 5/2011 | Basker et al. | |

* cited by examiner

*Primary Examiner* — Tan N Tran
(74) *Attorney, Agent, or Firm* — Scully, Scott, Murphy & Presser, P.C.; H. Daniel Schnurmann

(57) ABSTRACT

A dielectric metal compound liner can be deposited on a semiconductor fin prior to formation of a disposable gate structure. The dielectric metal compound liner protects the semiconductor fin during the pattering of the disposable gate structure and a gate spacer. The dielectric metal compound liner can be removed prior to formation of source and drain regions and a replacement gate structure. Alternately, a dielectric metal compound liner can be deposited on a semiconductor fin and a gate stack, and can be removed after formation of a gate spacer. Further, a dielectric metal compound liner can be deposited on a semiconductor fin and a disposable gate structure, and can be removed after formation of a gate spacer and removal of the disposable gate structure. The dielectric metal compound liner can protect the semiconductor fin during formation of the gate spacer in each embodiment.

9 Claims, 21 Drawing Sheets

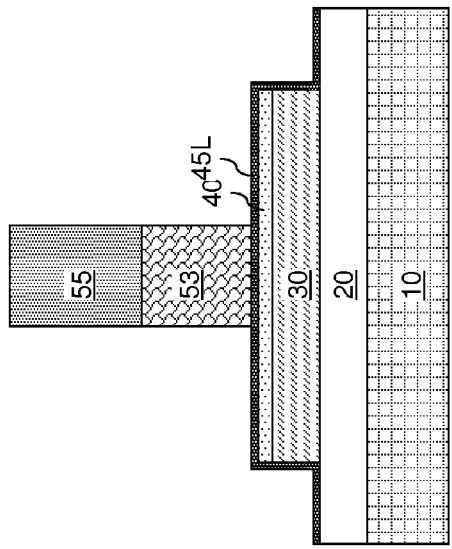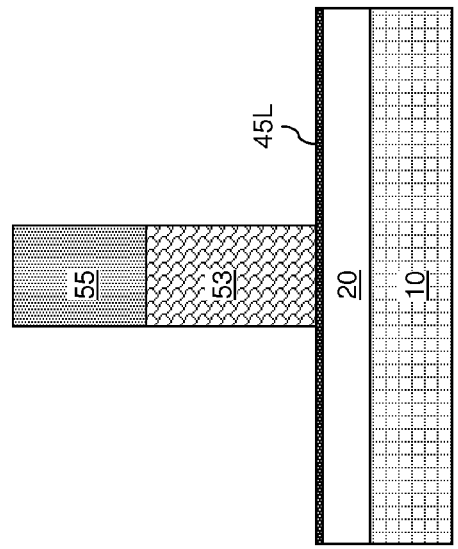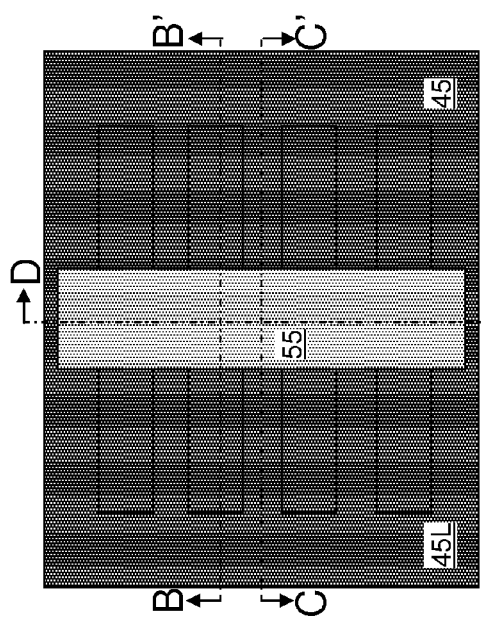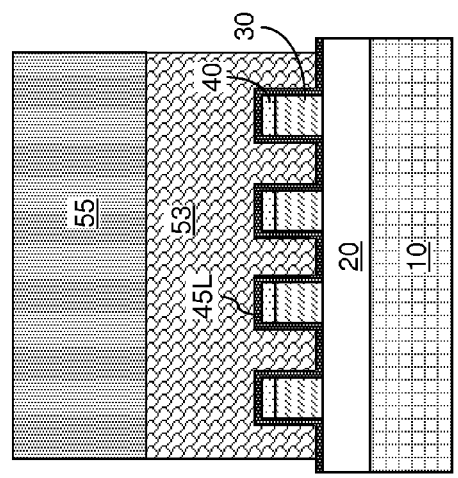
FIG. 4A
FIG. 4B
FIG. 4C
FIG. 4D

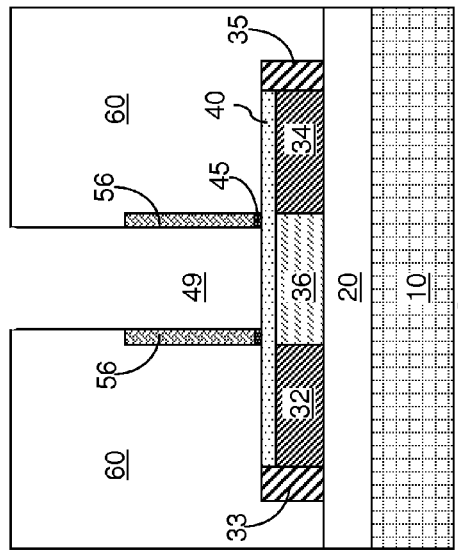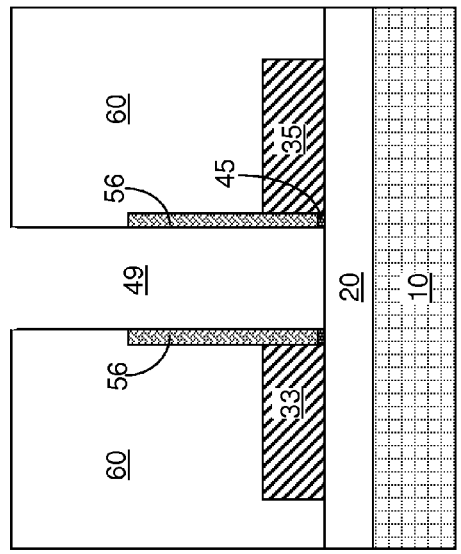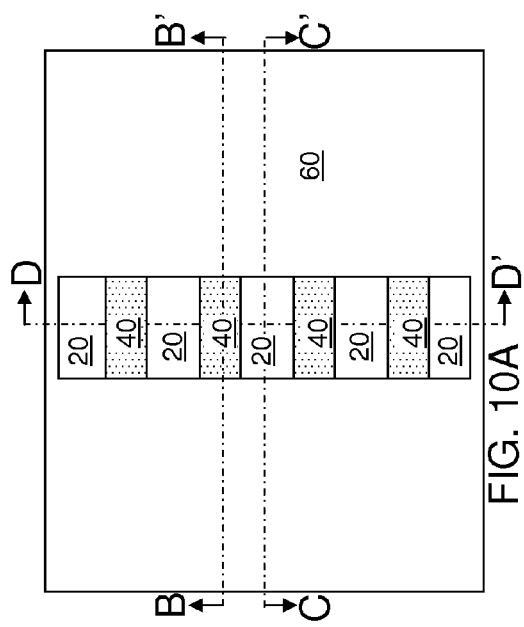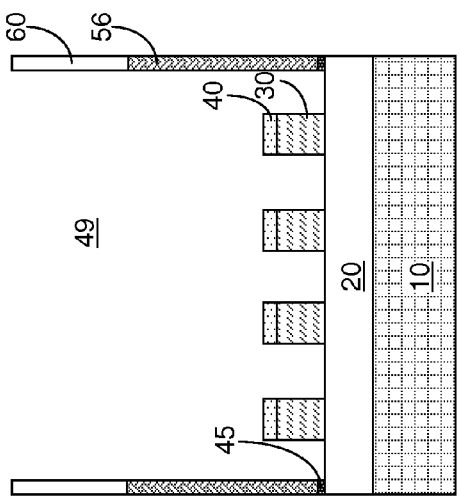

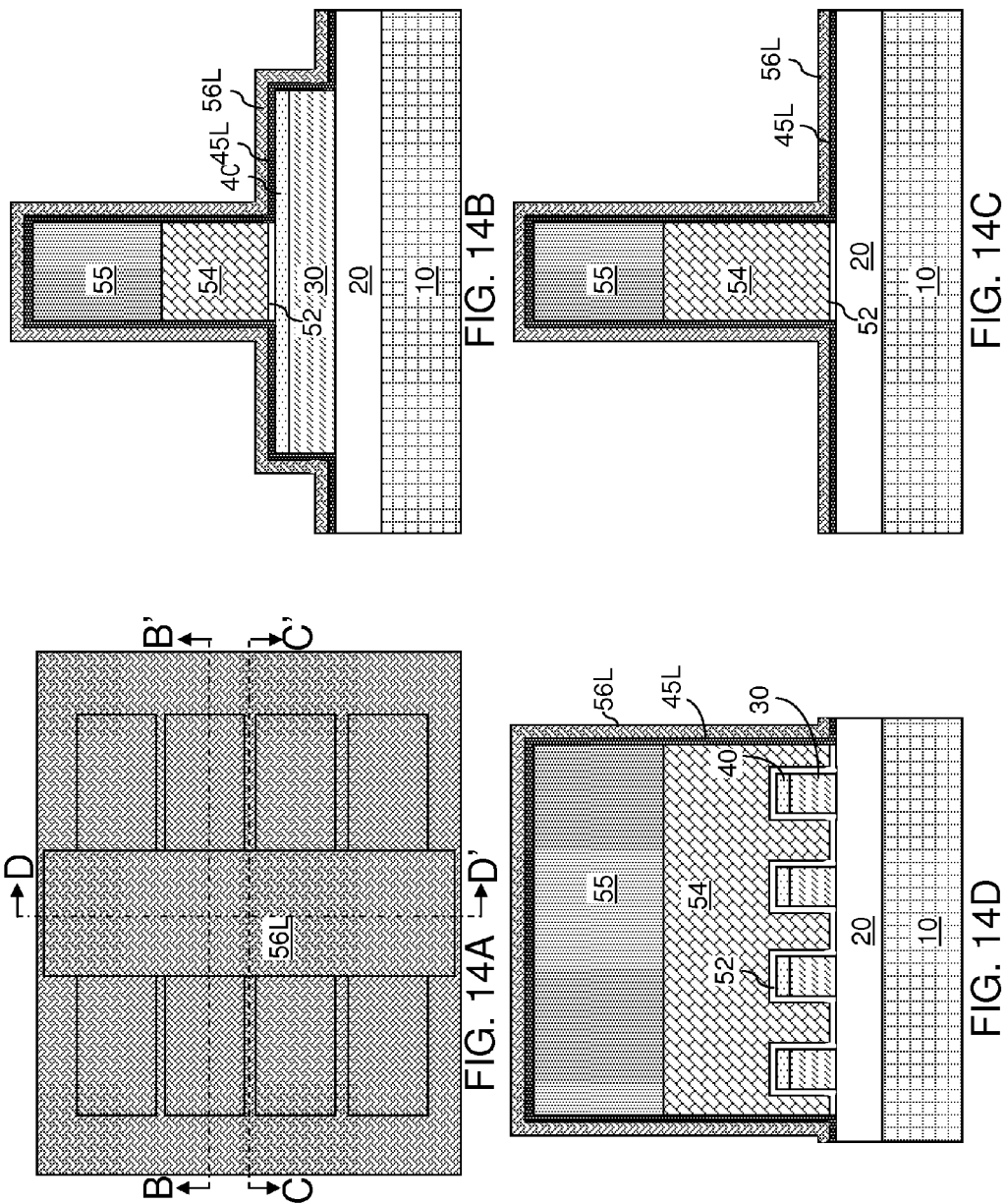

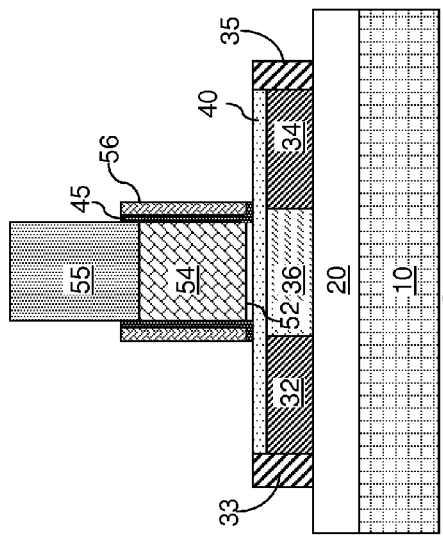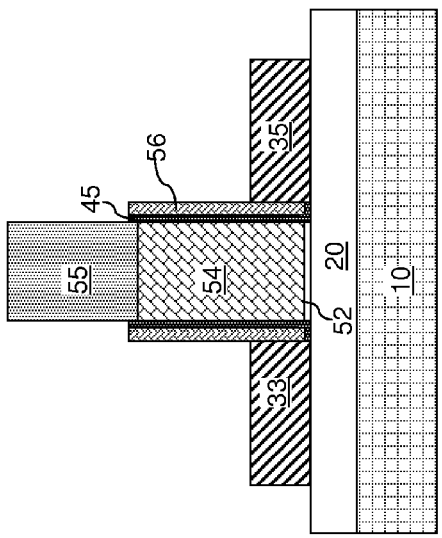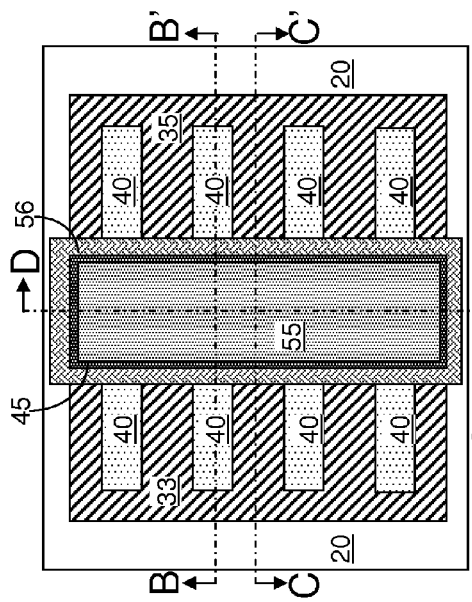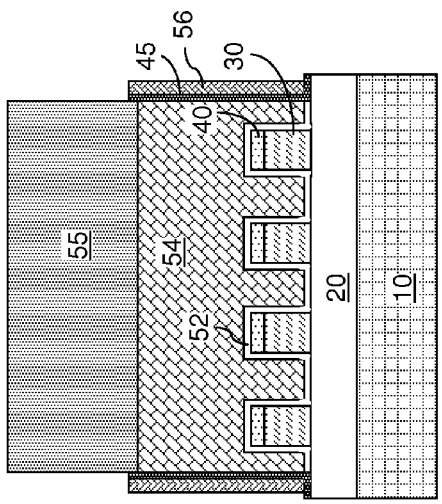

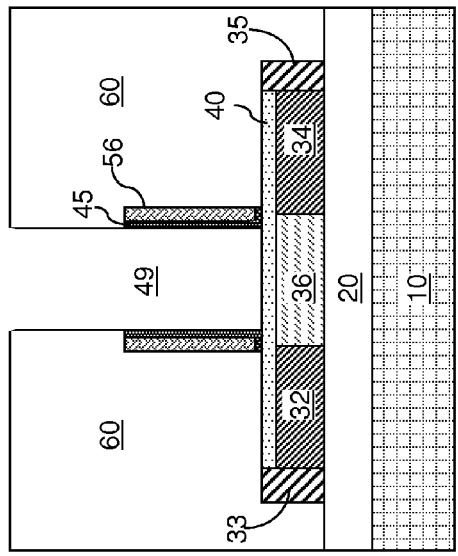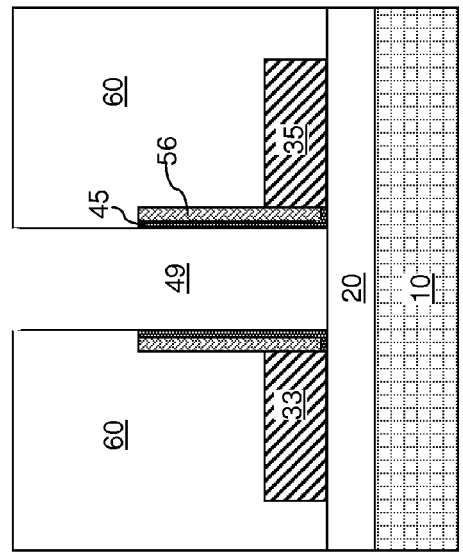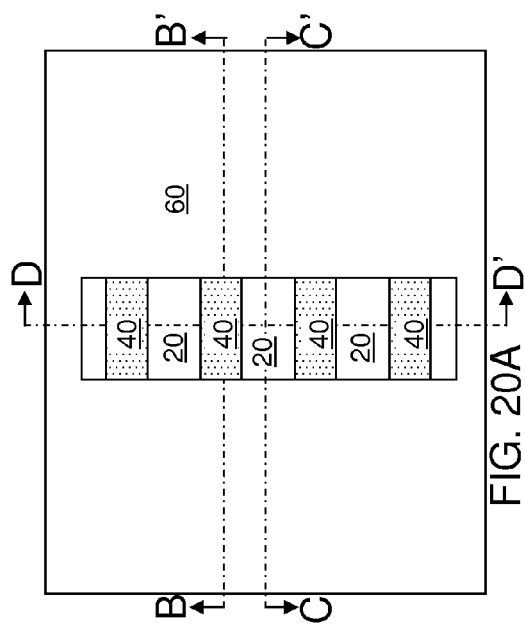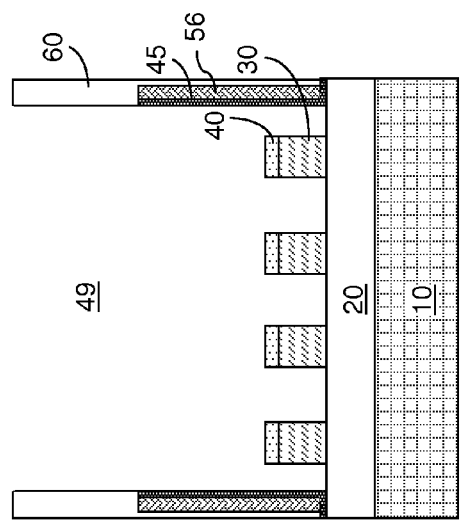

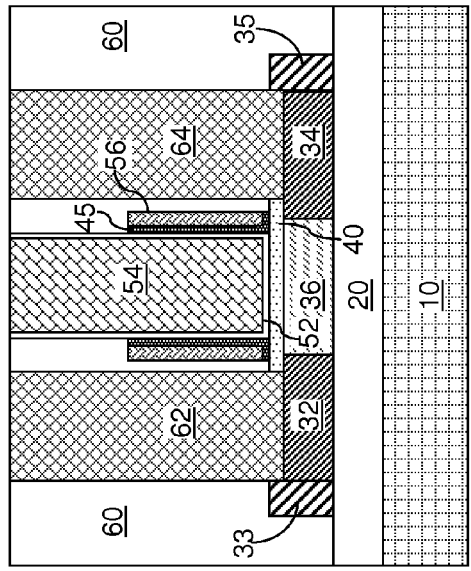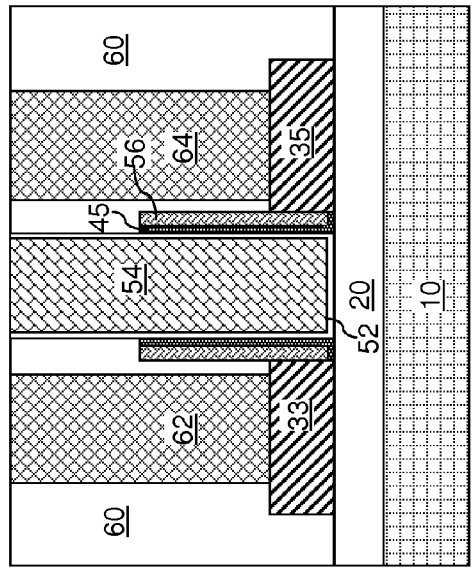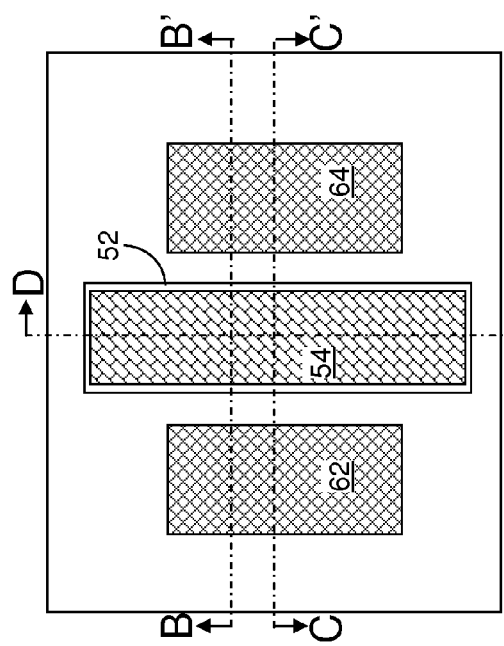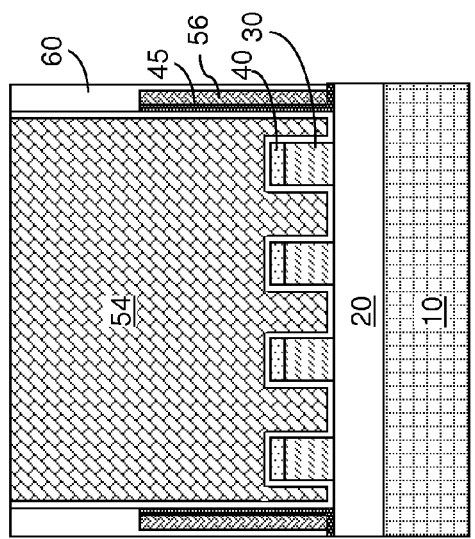

PREVENTION OF FIN EROSION FOR SEMICONDUCTOR DEVICES

BACKGROUND

The present disclosure relates to a semiconductor structure, and particularly to a structure for protecting a semiconductor fin from erosion during processing steps and a method of manufacturing the same.

During manufacturing of a fin field effect transistor, semiconductor fins can be eroded heavily and an insulator layer that fills the space between the fins can be severely gouged during anisotropic etch processes employed to form gate spacers. Erosion of semiconductor fins can lead to poorly defined source and drain regions and cause deleterious degradations in device performance of the fin field effect transistor.

BRIEF SUMMARY

A dielectric metal compound liner can be deposited on a semiconductor fin prior to formation of a disposable gate structure. The dielectric metal compound liner protects the semiconductor fin during the pattering of the disposable gate structure and a gate spacer. The dielectric metal compound liner can be removed prior to formation of source and drain regions and a replacement gate structure. Alternately, a dielectric metal compound liner can be deposited on a semiconductor fin and a gate stack, and can be removed after formation of a gate spacer. Further, a dielectric metal compound liner can be deposited on a semiconductor fin and a disposable gate structure, and can be removed after formation of a gate spacer and removal of the disposable gate structure. The dielectric metal compound liner can protect the semiconductor fin during formation of the gate spacer in each embodiment.

According to an aspect of the present disclosure, a semiconductor structure includes a semiconductor fin located on a substrate, and a gate stack of a gate dielectric and a gate electrode. The gate stack straddles a portion of the semiconductor fin. The semiconductor structure further includes a gate spacer laterally surrounding the gate stack, and a dielectric metal compound portion contacting a top surface and sidewall surfaces of the semiconductor fin, a portion of sidewalls of the gate stack, and a bottom surface of the gate spacer.

According to another aspect of the present disclosure, a method of forming a semiconductor structure is provided. A semiconductor fin is formed on a substrate. A dielectric metal compound liner is deposited directly on surfaces of the semiconductor fin. A disposable gate structure straddling the semiconductor fin is formed over the dielectric metal compound liner. A gate spacer is formed on the dielectric metal compound liner and the disposable gate structure. Portions of the dielectric metal compound liner are removed after forming the gate spacer. A remaining portion of the dielectric metal compound liner underneath the gate spacer constitutes a dielectric metal compound portion.

According to yet another aspect of the present disclosure, another method of forming a semiconductor structure is provided. A semiconductor fin is formed on a substrate. A gate structure straddling the semiconductor fin is then formed. A dielectric metal compound liner is deposited directly on surfaces of the semiconductor fin and the gate structure. A gate spacer is formed on the dielectric metal compound liner and around the gate structure. Portions of the dielectric metal compound liner are removed employing the gate spacer as an etch mask. A remaining portion of the dielectric metal compound liner underneath the gate spacer constitutes a dielectric metal compound portion.

BRIEF DESCRIPTION OF SEVERAL VIEWS OF THE DRAWINGS

FIG. 4A is a top-down view of the first exemplary semiconductor structure after formation of a disposable gate structure according to the first embodiment of the present disclosure.

FIG. 4B is a vertical cross-sectional view of the first exemplary semiconductor structure along the vertical plane B-B' of FIG. 4A.

FIG. 4C is a vertical cross-sectional view of the first exemplary semiconductor structure along the vertical plane C-C' of FIG. 4A.

FIG. 4D is a vertical cross-sectional view of the first exemplary semiconductor structure along the vertical plane D-D' of FIG. 4A.

FIG. 10A is a top-down view of the first exemplary semiconductor structure after removal of the disposable gate structure according to the first embodiment of the present disclosure.

FIG. 10B is a vertical cross-sectional view of the first exemplary semiconductor structure along the vertical plane B-B' of FIG. 10A.

FIG. 10C is a vertical cross-sectional view of the first exemplary semiconductor structure along the vertical plane C-C' of FIG. 10A.

FIG. 10D is a vertical cross-sectional view of the first exemplary semiconductor structure along the vertical plane D-D' of FIG. 10A.

FIG. 14A is a vertical cross-sectional view of the second exemplary semiconductor structure after formation of a contiguous dielectric material layer according to the second embodiment of the present disclosure.

FIG. 14B is a vertical cross-sectional view of the second exemplary semiconductor structure along the vertical plane B-B' of FIG. 14A.

FIG. 14C is a vertical cross-sectional view of the second exemplary semiconductor structure along the vertical plane C-C' of FIG. 14A.

FIG. 14D is a vertical cross-sectional view of the second exemplary semiconductor structure along the vertical plane D-D' of FIG. 14A.

FIG. 16A is a top-down view of the second exemplary semiconductor structure after formation of a raised source region and a raised drain region according to the second embodiment of the present disclosure.

FIG. 16B is a vertical cross-sectional view of the second exemplary semiconductor structure along the vertical plane B-B' of FIG. 16A.

FIG. 16C is a vertical cross-sectional view of the second exemplary semiconductor structure along the vertical plane C-C' of FIG. 16A.

FIG. 16D is a vertical cross-sectional view of the second exemplary semiconductor structure along the vertical plane D-D' of FIG. 16A.

FIG. 20A is a top-down view of a third exemplary semiconductor structure after formation of a gate cavity according to the third embodiment of the present disclosure.

FIG. 20B is a vertical cross-sectional view of the third exemplary semiconductor structure along the vertical plane B-B' of FIG. 20A.

FIG. 20C is a vertical cross-sectional view of the third exemplary semiconductor structure along the vertical plane C-C' of FIG. 20A.

FIG. 20D is a vertical cross-sectional view of the third exemplary semiconductor structure along the vertical plane D-D' of FIG. 20A.

FIG. 21A is a top-down view of the third exemplary semiconductor structure after formation of a replacement gate structure and various contact via structures according to the third embodiment of the present disclosure.

FIG. 21B is a vertical cross-sectional view of the third exemplary semiconductor structure along the vertical plane B-B' of FIG. 21A.

FIG. 21C is a vertical cross-sectional view of the third exemplary semiconductor structure along the vertical plane C-C' of FIG. 21A.

FIG. 21D is a vertical cross-sectional view of the third exemplary semiconductor structure along the vertical plane D-D' of FIG. 21A.

DETAILED DESCRIPTION

Figure 1A:
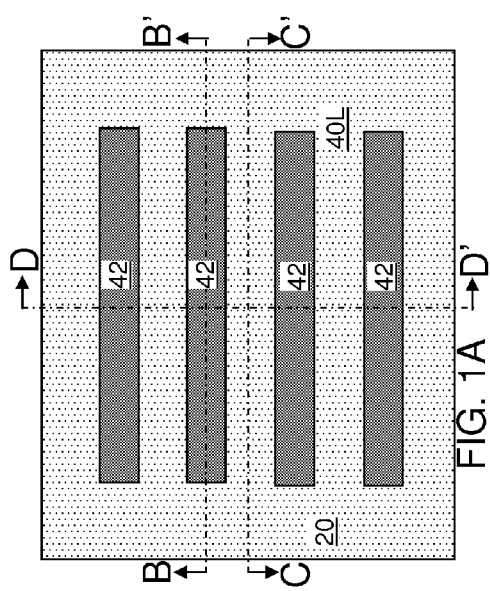
FIG. 1A is a top-down view of a first exemplary semiconductor structure after formation of an optional dielectric cap layer and a plurality of fin-defining mask structures according to a first embodiment of the present disclosure.

As stated above, the present disclosure relates to a structure for protecting a semiconductor fin from erosion during processing steps and a method of manufacturing the same. Aspects of the present disclosure are now described in detail with accompanying figures. It is noted that like reference numerals refer to like elements across different embodiments. The drawings are not necessarily drawn to scale.

Figure 1B:
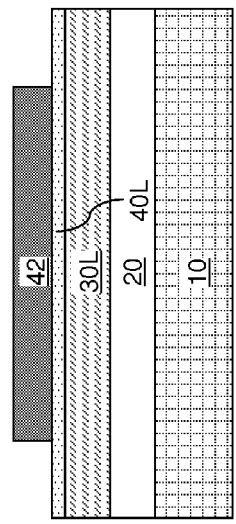
FIG. 1B is a vertical cross-sectional view of the first exemplary semiconductor structure along the vertical plane B-B' of FIG. 1A.
Figure 1C:
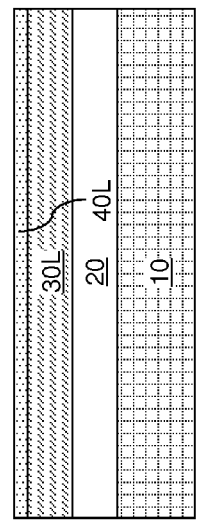
FIG. 1C is a vertical cross-sectional view of the first exemplary semiconductor structure along the vertical plane C-C' of FIG. 1A.
Figure 1D:
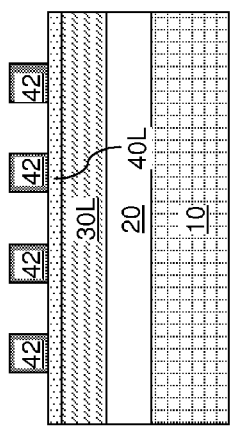
FIG. 1D is a vertical cross-sectional view of the first exemplary semiconductor structure along the vertical plane D-D' of FIG. 1A.

Referring to FIGS. 1A, 1B, 1C, and 1D, a first exemplary semiconductor structure according to a first embodiment of the present disclosure includes a semiconductor-on-insulator (SOI) substrate. The SOI substrate can include a stack, from bottom to top, of a handle substrate 10, a buried insulator layer 20, and a top semiconductor layer 30L. While an embodiment employing an SOI substrate is illustrated herein, the methods of the present disclosure can also be employed with a bulk semiconductor substrate. Such variations are expressly contemplated herein.

The handle substrate 10 can include a semiconductor material, a conductive material, and/or a dielectric material. The handle substrate 10 provides mechanical support to the buried insulator layer 20 and the top semiconductor layer 30L. The thickness of the handle substrate 10 can be from 30 microns to 2 mm, although lesser and greater thicknesses can also be employed.

The buried insulator layer 20 is an insulator layer, and includes a dielectric material such as silicon oxide, silicon nitride, silicon oxynitride, or a combination thereof. The thickness of the buried insulator layer 20 can be from 50 nm to 5 microns, although lesser and greater thicknesses can also be employed.

The top semiconductor layer 30L is a semiconductor material layer including a semiconductor material. The semiconductor material can be an elemental semiconductor material or a compound semiconductor material. For example, the semiconductor material can be silicon, germanium, a silicon-germanium alloy, or a silicon-carbon alloy. The semiconductor material may or may not be doped with p-type dopants and/or n-type dopants. The semiconductor material can be a single crystalline semiconductor material, a polycrystalline semiconductor material, or an amorphous semiconductor material. In one embodiment, the semiconductor material can be silicon. In one embodiment, the semiconductor material can be single crystalline silicon. The thickness of the top semiconductor layer 30L can be from 10 nm to 500 nm, although lesser and greater thicknesses can also be employed.

An optional dielectric cap layer 40L can be formed on the top surface of the top semiconductor layer 30L. The optional dielectric cap layer 40L includes a dielectric material, which can be, for example, silicon oxide, silicon oxynitride, a dielectric metal oxide, or a combination thereof. The optional dielectric cap layer 40L can be formed, for example, by chemical vapor deposition (CVD) or conversion of a topmost portion of the top semiconductor layer 30L by thermal oxidation, thermal nitridation, plasma oxidation, plasma nitridation, or a combination thereof. The thickness of the optional dielectric cap layer 40L can be from 1 nm to 20 nm, although lesser and greater thicknesses can also be employed.

A plurality of fin-defining mask structures 42 can be formed over the top semiconductor layer 30L. The plurality of fin-defining mask structures 42 can be formed directly on the optional dielectric cap layer 40L, if present. The plurality of fin-defining mask structures 42 are mask structures that cover the regions of the top semiconductor layer 30L that are subsequently converted into semiconductor fins. Thus, the plurality of fin-defining mask structures 42 are subsequently employed to define the area of the semiconductor fins. The plurality of fin-defining mask structures 42 can include a dielectric material such as silicon nitride, silicon oxide, and silicon oxynitride.

The plurality of fin-defining mask structures 42 can be formed, for example, by depositing a planar dielectric material layer and lithographically patterning the dielectric material layer. The planar dielectric material layer can be deposited, for example, by chemical vapor deposition (CVD). The thickness of the planar dielectric material layer can be from 5 nm to 100 nm, although lesser and greater thicknesses can also be employed.

The planar dielectric material layer can be subsequently patterned to form the plurality of fin-defining mask structures 42. In one embodiment, each fin-defining mask structure 42 in the plurality of fin-defining mask structures 42 can laterally extend along a lengthwise direction (e.g., the horizontal direction within the B-B' plane or the C-C' plane). As used herein, a lengthwise direction of a structure refers to the direction along which extremal portions the structure extend. Further, each fin-defining mask structure 42 in the plurality of fin-defining mask structures 42 can have a pair of sidewalls that are separated along a widthwise direction, which is perpendicular to the lengthwise direction. In one embodiment, each fin-defining mask structure 42 in the plurality of fin-defining mask structures 42 can have a rectangular horizontal cross-sectional area. In one embodiment, the fin-defining mask structures 42 in the plurality of fin-defining mask structures 42 can have the same width w.

Figure 2A:
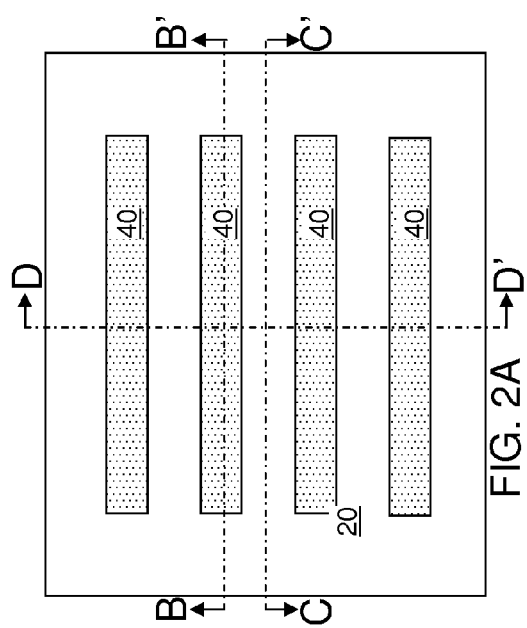
FIG. 2A is a top-down view of the first exemplary semiconductor structure after patterning of a semiconductor material layer into a plurality of semiconductor fins according to the first embodiment of the present disclosure.
Figure 2B:
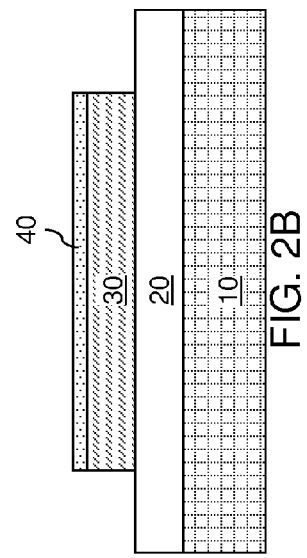
FIG. 2B is a vertical cross-sectional view of the first exemplary semiconductor structure along the vertical plane B-B' of FIG. 2A.
Figure 2C:
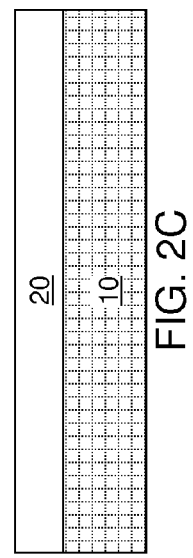
FIG. 2C is a vertical cross-sectional view of the first exemplary semiconductor structure along the vertical plane C-C' of FIG. 2A.
Figure 2D:
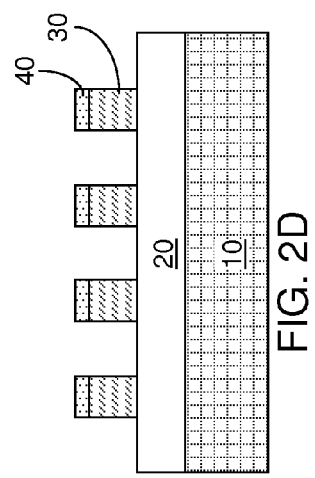
FIG. 2D is a vertical cross-sectional view of the first exemplary semiconductor structure along the vertical plane D-D' of FIG. 2A.

Referring to FIGS. 2A, 2B, 2C, and 2D, the pattern in the plurality of fin-defining mask structures 42 is transferred into the optional dielectric cap layer 40L and the top semiconductor layer 30L by an anisotropic etch. The remaining portions of the optional dielectric cap layer 40L are herein referred to as optional dielectric fin caps 40, and the remaining portions of the top semiconductor layer 30L constitute semiconductor fins 30. The vertically sidewalls of the optional dielectric fin caps 40 and the semiconductor fins 30 can be substantially vertically coincident. As used herein, a first surface is vertically coincident with a second surface if the first surface and the second surface are within a same vertical plane. As used herein, a first surface is substantially vertically coincident with a second surface if the lateral distance between the first surface and the second surface is less than the sum of the root mean square roughness of the first surface and the root mean square roughness of the second surface. The plurality of fin-defining mask structure 42 can be removed during the anisotropic etch, or can be removed after the anisotropic etch employing a selective etch process that removes the material of the plurality of fin-defining mask structure 42 selective to the material of the semiconductor fins 30 and the optional dielectric fin caps 40.

Figure 3A:
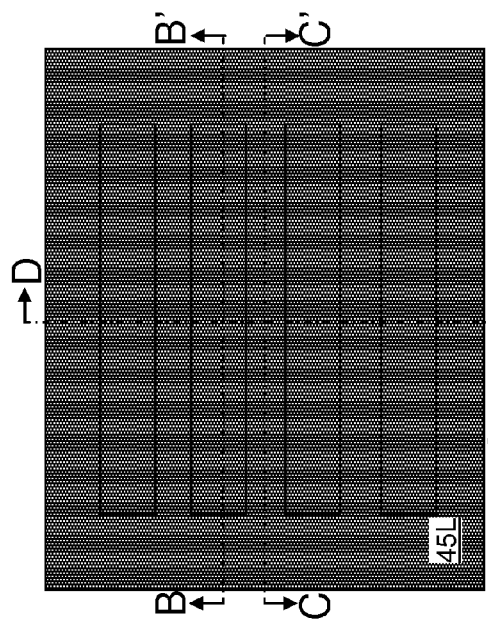
FIG. 3A is a top-down view of the first exemplary semiconductor structure after formation of a dielectric metal compound liner according to the first embodiment of the present disclosure.
Figure 3B:
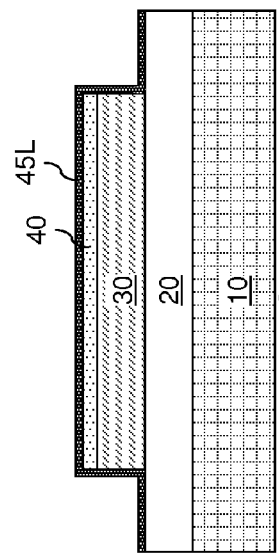
FIG. 3B is a vertical cross-sectional view of the first exemplary semiconductor structure along the vertical plane B-B' of FIG. 3A.
Figure 3C:
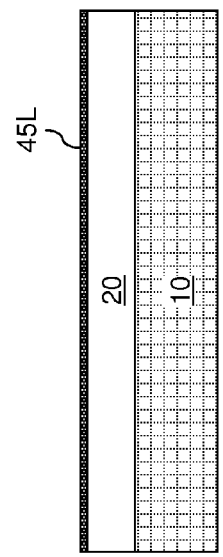
FIG. 3C is a vertical cross-sectional view of the first exemplary semiconductor structure along the vertical plane C-C' of FIG. 3A.
Figure 3D:
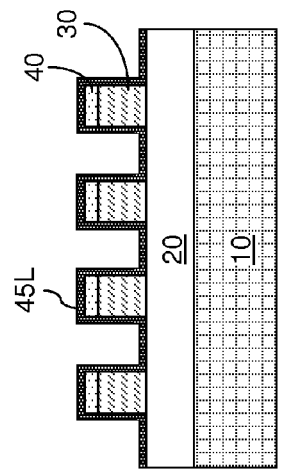
FIG. 3D is a vertical cross-sectional view of the first exemplary semiconductor structure along the vertical plane D-D' of FIG. 3A.

Referring to FIGS. 3A, 3B, 3C, and 3D, a dielectric metal compound liner 45L is deposited directly on surfaces of the semiconductor fins 30 and the optional dielectric fin caps 40 as a contiguous material layer. The dielectric metal compound liner 45L includes a dielectric metal compound, i.e., a dielectric material including a metal-containing compound.

In one embodiment, the dielectric metal compound liner 45L includes a dielectric metal oxide or a dielectric metal oxynitride such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In one embodiment, the dielectric metal oxide or a dielectric metal oxynitride can have a dielectric constant greater than 8.0.

The thickness of the dielectric metal compound liner 45L can be from 0.6 nm to 10 nm, although lesser and greater thicknesses can also be employed. In one embodiment, the dielectric metal compound liner 45L can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. In one embodiment, the dielectric metal compound liner 45L can be formed as a conformal material layer having a uniform thickness throughout.

Referring to FIGS. 4A, 4B, 4C, and 4D, a disposable gate structure can be formed. The disposable gate structure can include a vertical stack of a disposable gate material portion 53 and a disposable gate cap portion 55. The disposable gate structure (53, 55) can be formed, for example, by depositing a disposable gate material layer (not shown) and a disposable gate cap layer (not shown), and subsequently lithographically patterning the disposable gate material layer and the disposable gate cap layer. A remaining portion of the disposable gate material layer after the lithographic patterning constitutes the disposable gate material portion 53, and a remaining portion of the disposable gate cap layer after the lithographic patterning constitutes the disposable gate cap portion 55.

The disposable gate material layer includes a material that can be removed selective to the material of the dielectric metal compound liner 45L. In this case, the disposable gate material layer can include a semiconductor material, a dielectric material that is different from the material of the dielectric metal compound liner 45L, or a metallic material. Exemplary semiconductor materials that can be employed for the disposable gate material layer include silicon, germanium, a silicon germanium alloy, a silicon carbon alloy, a compound semiconductor material, or a combination thereof. The disposable gate material layer can be deposited, for example, by chemical vapor deposition (CVD). The thickness of the disposable gate material layer, as measured above a planar surface, can be from 50 nm to 600 nm, although lesser and greater thicknesses can also be employed.

The disposable gate cap layer can includes a material that can be employed as a stopping layer for a planarization process to be subsequently employed. For example, the disposable gate cap layer can include silicon nitride, silicon oxide, silicon oxynitride, or a combination thereof. The thickness of the disposable gate cap layer can be from 20 nm to 300 nm, although lesser and greater thicknesses can also be employed.

A photoresist layer (not shown) can be applied over the stack, from bottom to top, of the disposable gate material layer and the disposable gate cap layer. The photoresist layer can be subsequently patterned into gate patterns, which can include a line that runs perpendicular to, and intersects, the semiconductor fins 30. Physically exposed portions of the disposable gate material layer and the disposable gate cap layer, i.e., portions of the disposable gate material layer and the disposable gate cap layer that are not covered by the patterned photoresist layer, are removed, for example, by an etch, which can be an anisotropic etch. The disposable gate structure (53, 55) that includes the stack of the disposable gate material portion 53 and the disposable gate cap portion 55 straddles middle portions of the semiconductor fins 30 and the dielectric metal compound liner 45L.

Optionally, ion implantations such as source/drain extension ion implantations and halo ion implantations can be performed employing the disposable gate structure (53, 55) as a self-aligned implantation mask.

Figure 5B:
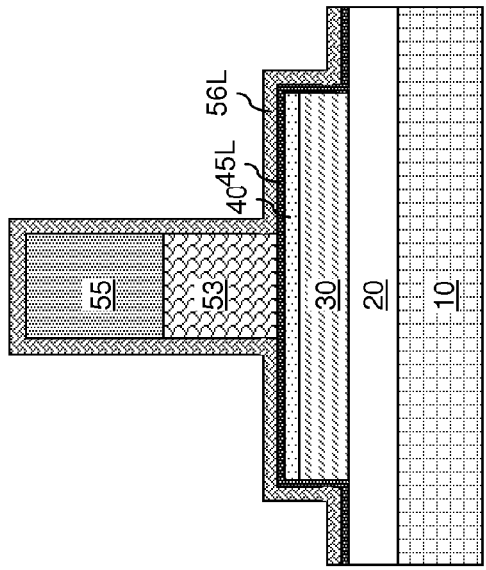
FIG. 5B is a vertical cross-sectional view of the first exemplary semiconductor structure along the vertical plane B-B' of FIG. 5A.
Figure 5C:
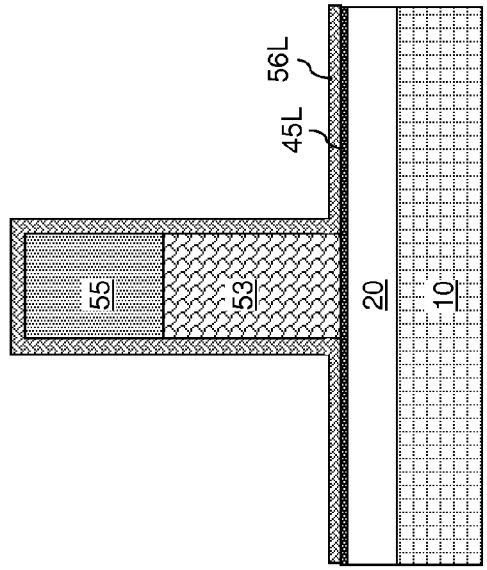
FIG. 5C is a vertical cross-sectional view of the first exemplary semiconductor structure along the vertical plane C-C' of FIG. 5A.
Figure 5A:
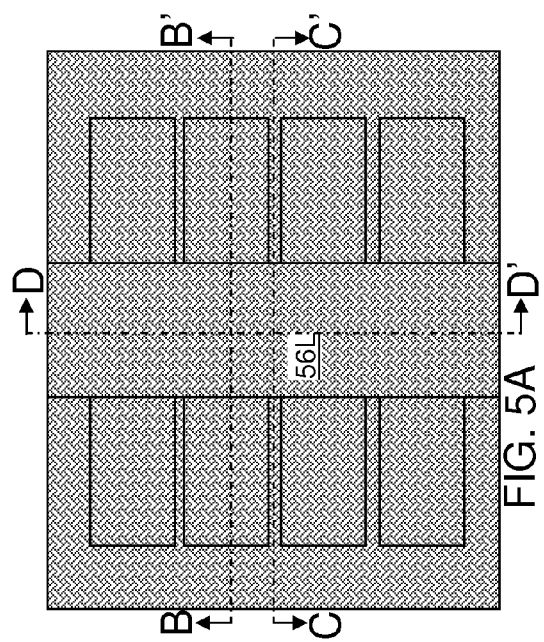
FIG. 5A is a top-down view of the first exemplary semiconductor structure after formation of a contiguous dielectric material layer according to the first embodiment of the present disclosure.
Figure 5D:
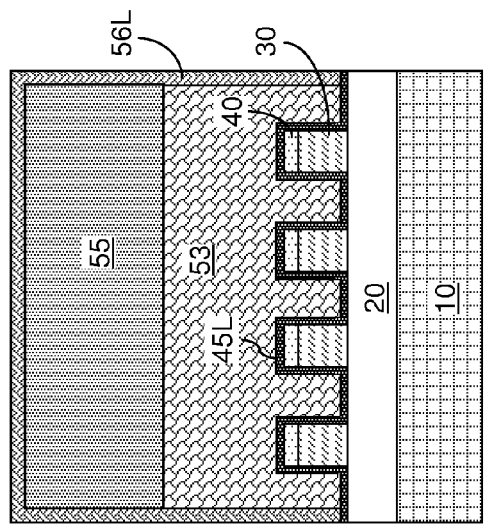
FIG. 5D is a vertical cross-sectional view of the first exemplary semiconductor structure along the vertical plane D-D' of FIG. 5A.

Referring to FIGS. 5A, 5B, 5C, and 5D, a contiguous dielectric material layer 56L is deposited on the physically exposed surfaces of the disposable gate structure (53, 55) and the dielectric metal compound liner 45L. The contiguous dielectric material layer 56L includes a dielectric material such as silicon oxide, silicon nitride, or silicon oxynitride. The contiguous dielectric material layer 56L can be deposited, for example, by chemical vapor deposition (CVD) or atomic layer deposition (ALD). The thickness of the dielectric material layer 56L can be from 3 nm to 100 nm, although lesser and greater thicknesses can also be employed.

Figure 6B:
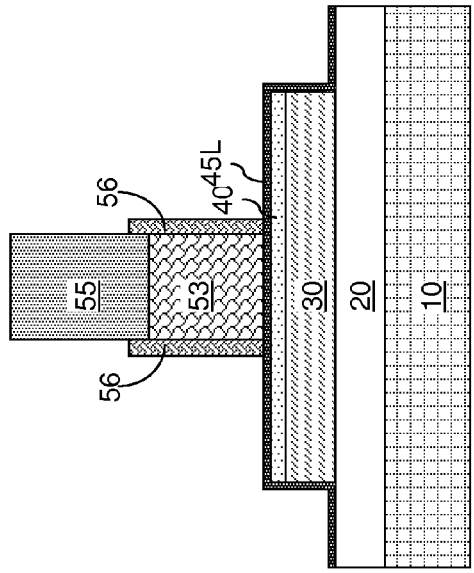
FIG. 6B is a vertical cross-sectional view of the first exemplary semiconductor structure along the vertical plane B-B' of FIG. 6A.
Figure 6C:
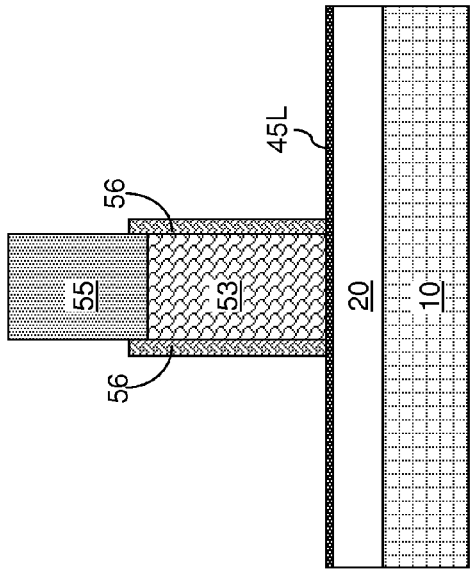
FIG. 6C is a vertical cross-sectional view of the first exemplary semiconductor structure along the vertical plane C-C' of FIG. 6A.
Figure 6A:
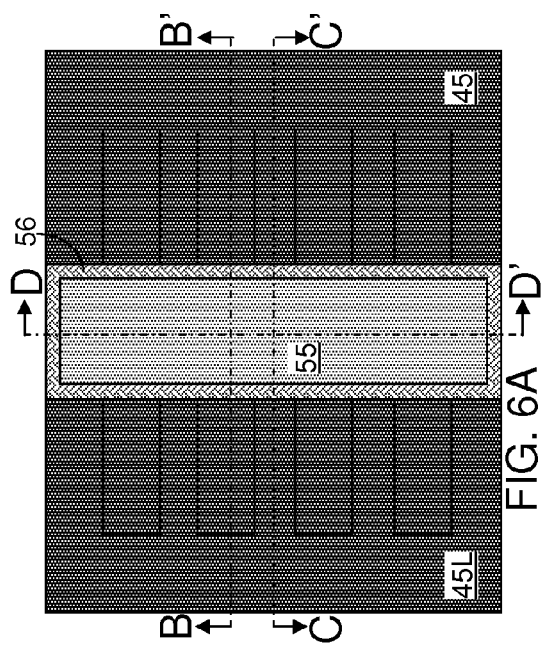
FIG. 6A is a top-down view of the first exemplary semiconductor structure after formation of gate spacers according to the first embodiment of the present disclosure.
Figure 6D:
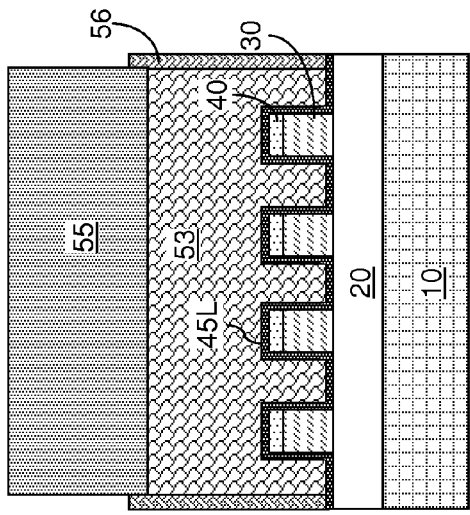
FIG. 6D is a vertical cross-sectional view of the first exemplary semiconductor structure along the vertical plane D-D' of FIG. 6A.

Referring to FIGS. 6A, 6B, 6C, and 6D, an anisotropic etch is performed to remove horizontal portions of the contiguous dielectric material layer 56L and to remove vertical portions of the contiguous dielectric material layer 56L from portions of the sidewalls of the semiconductor fins 30 that laterally protrude from the sidewalls of the disposable gate structure (53, 55) by more than the thickness of the contiguous dielectric material layer 56L. In other words, the contiguous dielectric material layer 56L is anisotropically etched employing the dielectric metal compound liner 45L as an etch stop layer. A remaining vertical portion of the contiguous dielectric material layer 56L constitutes a gate spacer 56, which is a contiguous dielectric material portion that laterally surrounds the disposable gate structure (53, 55). All bottom surfaces of the gate spacer 56 contacts the dielectric metal compound liner 45L. All inner sidewall surfaces of the gate spacer 56 contacts the disposable gate structure (53, 55). Thus, the gate spacer 56 is formed directly on the dielectric metal compound liner 45L and the disposable gate structure (53, 55).

The dielectric metal compound liner 45L protects the semiconductor fins 30 throughout the etch process that forms the gate spacer 56. In order to remove the vertical portions of the contiguous dielectric material layer 56L from the sidewalls of the semiconductor fins 30, the material of the contiguous dielectric material layer 56L must be recessed at least by the height of the semiconductor fins 30 (or at least by the sum of the height of the semiconductor fins 30 and the height of the optional dielectric fin caps 40 if the optional dielectric fin caps 40 are present). The etch chemistry of the anisotropic etch is selected such that the dielectric metal compound liner 45L is resistant to the etch chemistry that forms the gate spacer 56. Etch chemistries that remove silicon oxide, silicon nitride, silicon oxynitride selective to a dielectric metal oxide or a dielectric metal oxynitride are known in the art.

Figure 7B:
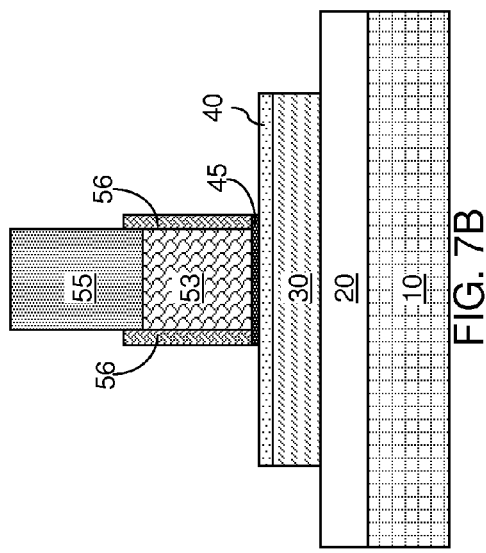
FIG. 7B is a vertical cross-sectional view of the first exemplary semiconductor structure along the vertical plane B-B' of FIG. 7A.
Figure 7C:
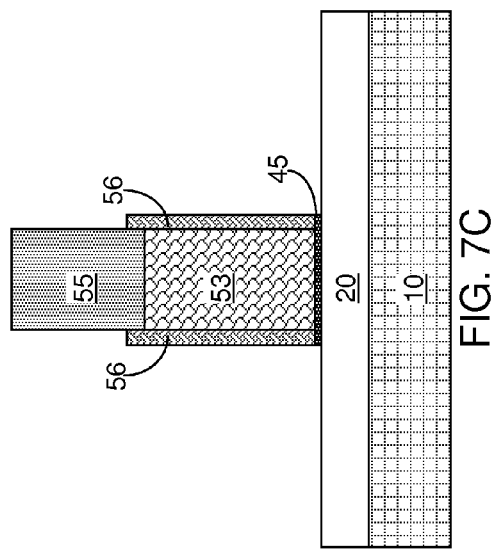
FIG. 7C is a vertical cross-sectional view of the first exemplary semiconductor structure along the vertical plane C-C' of FIG. 7A.
Figure 7A:
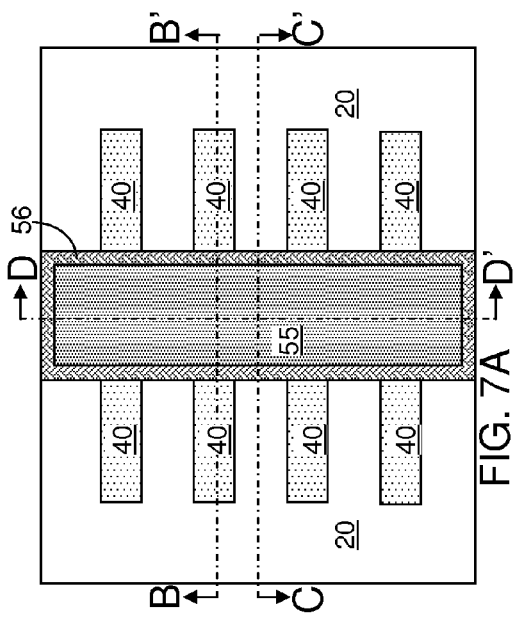
FIG. 7A is a top-down view of the first exemplary semiconductor structure after removal of physically exposed portions of the dielectric metal compound layer according to the first embodiment of the present disclosure.
Figure 7D:
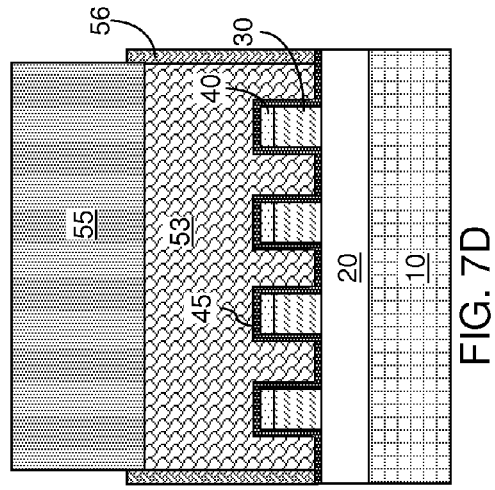
FIG. 7D is a vertical cross-sectional view of the first exemplary semiconductor structure along the vertical plane D-D' of FIG. 7A.

Referring to FIGS. 7A, 7B, 7C, and 7D, physically exposed portions of the dielectric metal compound layer 56L are removed selective to the semiconductor material of the semiconductor fins 30. An isotropic etch or an anisotropic etch can be employed. In one embodiment, an isotropic wet etch or an isotropic dry etch that removes a dielectric metal oxide or a dielectric metal oxynitride selective to the semiconductor material of the semiconductor fins 30 can be employed. Etch chemistries that remove a dielectric metal oxide or a dielectric metal oxynitride selective to semiconductor materials are known in the art. In one embodiment, the combination of the gate spacer 56 and the disposable gate structure (53, 55) can be used as an etch mask.

The remaining portion of the dielectric metal compound liner 45L underneath the gate spacer 56 constitutes a dielectric metal compound portion 45. In one embodiment, the outer periphery of the dielectric metal compound portion 45 can substantially vertically coincide with the outer periphery of the gate spacer 56. Semiconductor surfaces of the semiconductor fin 30 are physically exposed after removal of the physically exposed portions of the dielectric metal compound liner 45L.

Figure 8B:
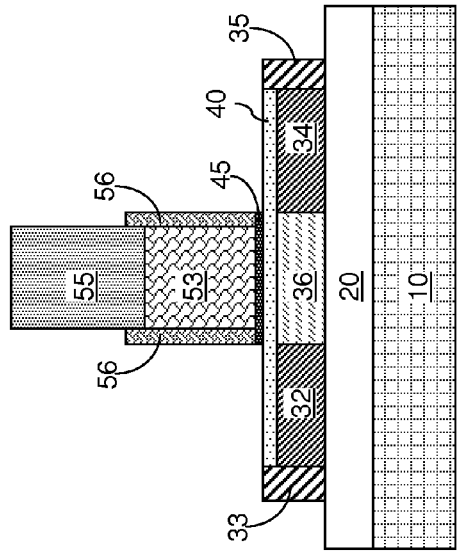
FIG. 8B is a vertical cross-sectional view of the first exemplary semiconductor structure along the vertical plane B-B' of FIG. 8A.
Figure 8C:
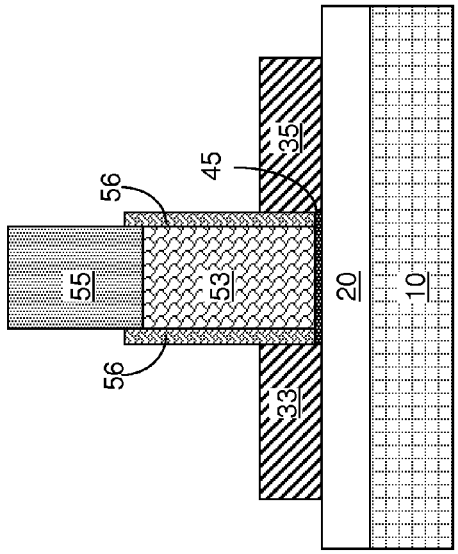
FIG. 8C is a vertical cross-sectional view of the first exemplary semiconductor structure along the vertical plane C-C' of FIG. 8A.
Figure 8A:
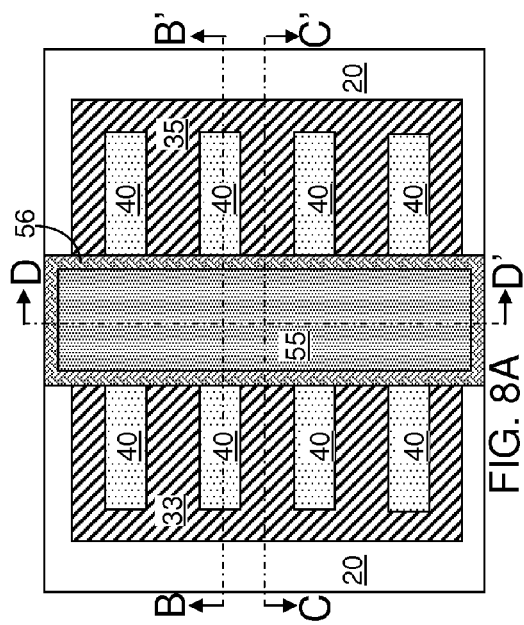
FIG. 8A is a top-down view of the first exemplary semiconductor structure after formation of a raised source region and a raised drain region according to the first embodiment of the present disclosure.
Figure 8D:
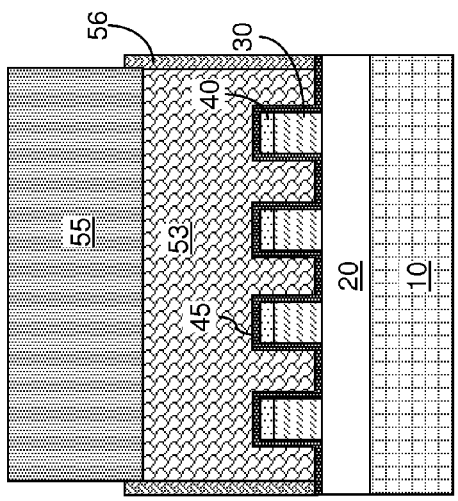
FIG. 8D is a vertical cross-sectional view of the first exemplary semiconductor structure along the vertical plane D-D' of FIG. 8A.

Referring to FIGS. 8A, 8B, 8C, and 8D, a raised source region 33 and a raised drain region 35 can optionally be formed, for example, by selective deposition of a semiconductor material. During the selective deposition, at least one reactant including a semiconductor precursor material and at least one etchant are concurrently or alternately flowed into a process chamber including the first exemplary semiconductor structure so that the semiconductor material is deposited on the semiconductor surfaces of the semiconductor fins 30 without nucleating the semiconductor material on dielectric surfaces such as the surfaces of the gate spacer 56 and the disposable gate cap portion 55. In one embodiment, the selective deposition can be selective epitaxy, and the raised source region 33 and the raised drain region 35 can include a single crystalline semiconductor material.

The semiconductor material of the raised source region 33 and the raised drain region 35 can be deposited with in-situ doping with dopants of a conductivity type, which can be p-type or n-type. The conductivity type of the raised source region 33 and the raised drain region 35 can be the opposite type of the conductivity type of the semiconductor fins 30 as provided at the processing steps of FIGS. 2A, 2B, 2C, and 2D. Alternately, the semiconductor material of the raised source region 33 and the raised drain region 35 can be deposited as an intrinsic semiconductor material and subsequently doped with dopants.

Figure 9A:
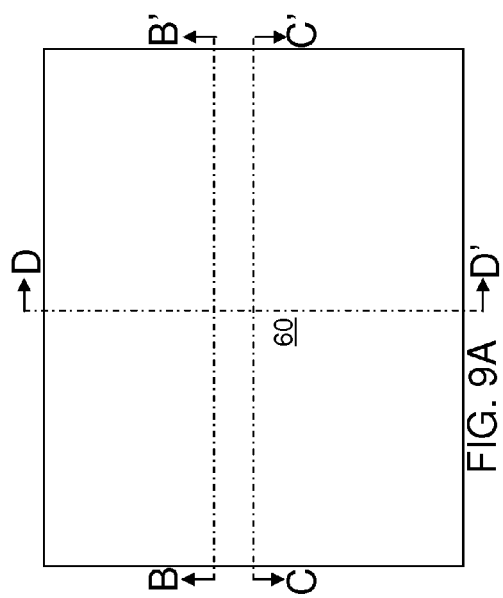
FIG. 9A is a top-down view of the first exemplary semiconductor structure after deposition and planarization of a planarization dielectric layer according to the first embodiment of the present disclosure.
Figure 9B:
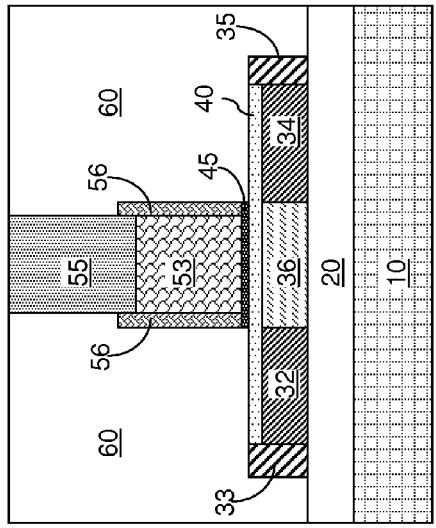
FIG. 9B is a vertical cross-sectional view of the first exemplary semiconductor structure along the vertical plane B-B' of FIG. 9A.
Figure 9C:
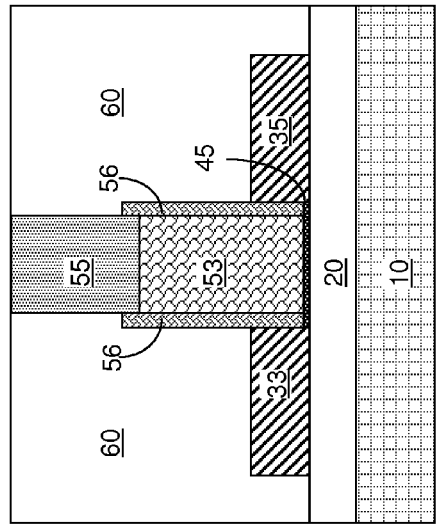
FIG. 9C is a vertical cross-sectional view of the first exemplary semiconductor structure along the vertical plane C-C' of FIG. 9A.
Figure 9D:
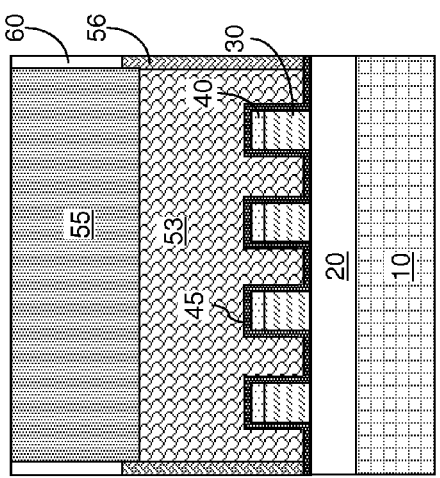
FIG. 9D is a vertical cross-sectional view of the first exemplary semiconductor structure along the vertical plane D-D' of FIG. 9A.

Referring to FIGS. 9A, 9B, 9C, and 9D, a planarization dielectric layer 60 is deposited over the disposable gate structure (53, 55) and the gate spacer 56, and is subsequently planarized. The planarization dielectric layer 60 includes a dielectric material having a different composition than the disposable gate cap portion 55. The planarization dielectric layer 60 can include, for example, silicon oxide, silicon nitride, or porous or non-porous organosilicate glass (OSG). In one embodiment, the planarization dielectric layer 60 can be planarized employing the disposable gate cap portion 55 as a stopping structure. In this case, the top surface of the planarization dielectric layer 60 is coplanar with the top surface of the disposable gate cap portion 55.

Referring to FIGS. 10A, 10B, 10C, and 10D, the disposable gate structure (53, 55) are removed selective to the semiconductor material of the semiconductor fins 30 and the dielectric material of the planarization dielectric layer 60 by at least one etch. A gate cavity 49 is formed in the space from which the disposable gate structure (53, 55) is removed. A physically exposed portion of the dielectric fin cap 40 may optionally be removed underneath the gate cavity 49.

A physically exposed sub-portion of the dielectric metal compound portion 45 is removed from underneath the gate cavity 49. In one embodiment, the inner periphery of the remaining portion of the dielectric metal compound portion 45 can be substantially vertically coincident with the inner sidewalls of the gate spacer 56 and sidewalls of the planarization dielectric layer 60. In one embodiment, the dielectric metal compound portion 45 can have a hole therein, and thus, can be homeomorphic to a torus having one hole, i.e., can be continuously stretched into the shape of a torus without forming or destroying a hole.

Figure 11A:
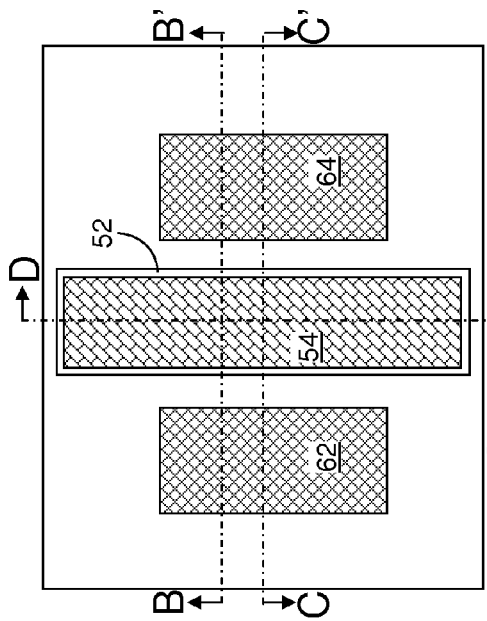
FIG. 11A is a top-down view of the first exemplary semiconductor structure after formation of a replacement gate structure and various contact via structures according to the first embodiment of the present disclosure.
Figure 11B:
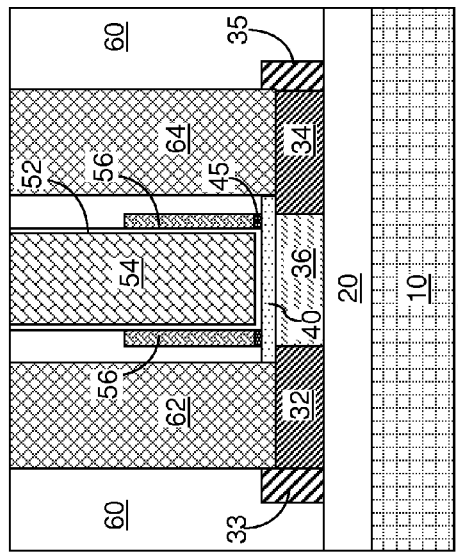
FIG. 11B is a vertical cross-sectional view of the first exemplary semiconductor structure along the vertical plane B-B' of FIG. 11A.
Figure 11C:
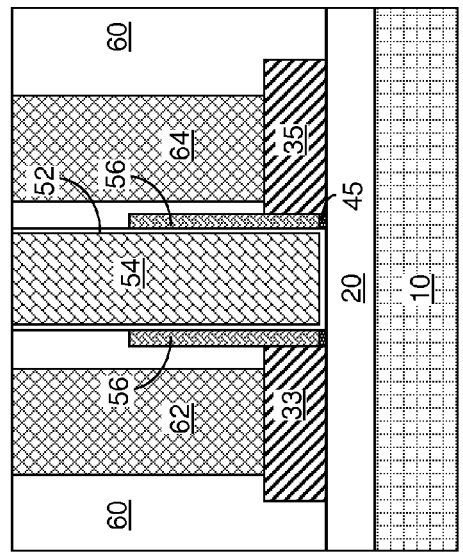
FIG. 11C is a vertical cross-sectional view of the first exemplary semiconductor structure along the vertical plane C-C' of FIG. 11A.
Figure 11D:
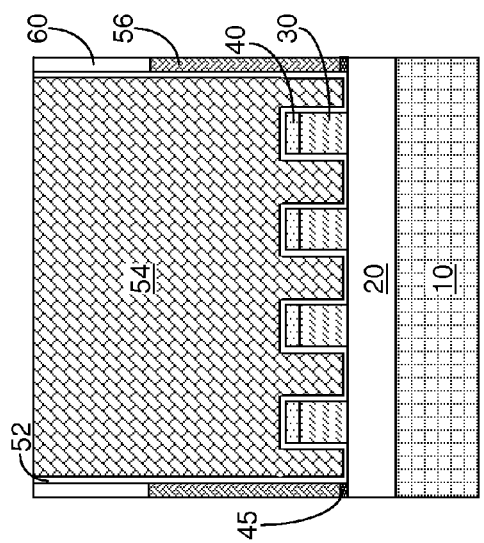
FIG. 11D is a vertical cross-sectional view of the first exemplary semiconductor structure along the vertical plane D-D' of FIG. 11A.

Referring to FIGS. 11A, 11B, 11C, and 11D, a replacement gate structure and various contact via structures can be formed. The replacement gate structure includes a gate dielectric 52 and a gate electrode 54. The gate dielectric 52 can include any gate dielectric material known in the art. In one embodiment, the gate dielectric 52 can include a dielectric metal oxide, a dielectric metal oxynitride, or a siliciate thereof. In one embodiment, the gate dielectric 52 can have a different composition from the dielectric metal compound portion 45 and/or can have a different thickness from the dielectric metal compound portion 45.

The gate electrode 54 includes at least one conductive material, which can include at least one conductive metallic compound material and/or at least one doped semiconductor material as known in the art.

The various contact via structures can be formed by forming contact via holes through the planarization dielectric layer 60 and filling the contact via holes with at least one conductive material. Optionally, metal semiconductor alloys (not shown) such as metal silicide materials may be formed at the bottom of at least one contact via hole. The various contact via structures can include, for example, a source-side contact via structure 62 and a drain-side contact via structure 64.

The first exemplary semiconductor structure includes at least one semiconductor fin 30 located on the buried insulator layer 20, which is an insulator layer. Further, the first exemplary semiconductor structure includes a gate stack (52, 54) of a gate dielectric 52 and a gate electrode 54. The gate stack (52, 54) straddles a portion of each of the at least one semiconductor fin 30. The first exemplary semiconductor structure further includes the gate spacer 56 laterally surrounding the gate stack (52, 54). Further, the first exemplary semiconductor structure includes the dielectric metal compound portion 45, which contacts a top surface and sidewall surfaces of each of the at least one semiconductor fin 30, a portion (i.e., a lower portion) of sidewalls of the gate stack (52, 54), and a bottom surface of the gate spacer 56.

The gate spacer 56 contacts another portion (i.e., an upper portion) of the sidewalls of the gate stack (52, 54). Specifically, the gate dielectric 52 can be a U-shaped gate dielectric contacting all inner sidewalls of the gate spacer 56 and all inner sidewalls of the dielectric metal compound portion 45. In this case, the dielectric metal compound portion 45 contacts a lower portion of the vertical sub-portion of the U-shaped gate dielectric, and the gate spacer 56 contacts an upper portion of the vertical sub-portion of the U-shaped gate dielectric.

The gate dielectric 52 can have a different composition, or a different thickness, than the dielectric metal compound portion 45. In one embodiment, the outer periphery of the dielectric metal compound portion 45 is substantially vertically coincident with the outer periphery of the gate spacer 56, and the inner periphery of the dielectric metal compound portion 45 is substantially vertically coincident with an inner periphery of the gate spacer 56.

Figure 12B:
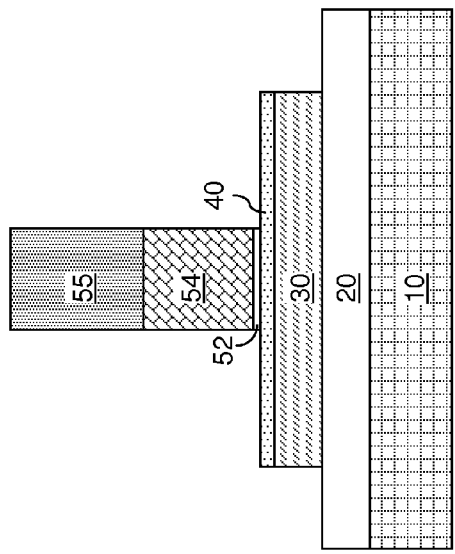
FIG. 12B is a vertical cross-sectional view of the second exemplary semiconductor structure along the vertical plane B-B' of FIG. 12A.
Figure 12C:
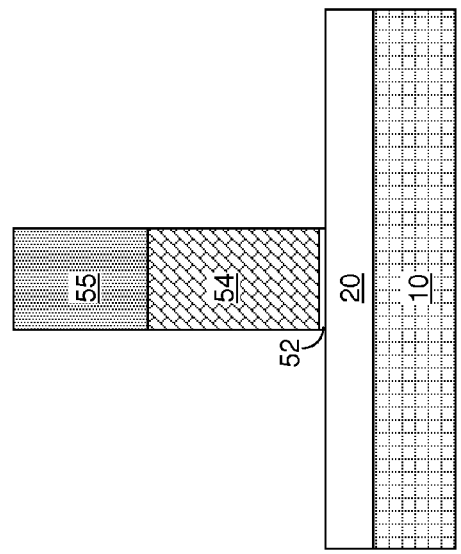
FIG. 12C is a vertical cross-sectional view of the second exemplary semiconductor structure along the vertical plane C-C' of FIG. 12A.
Figure 12A:
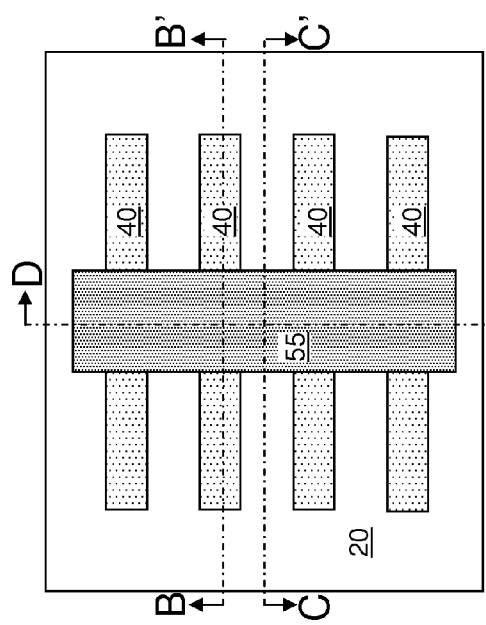
FIG. 12A is a top-down view of a second exemplary semiconductor structure after formation of a gate dielectric and a gate electrode according to a second embodiment of the present disclosure.
Figure 12D:
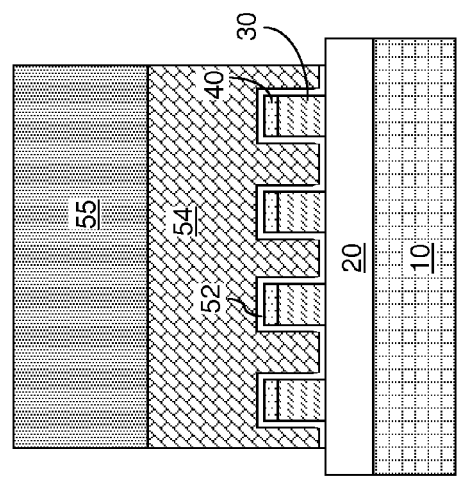
FIG. 12D is a vertical cross-sectional view of the second exemplary semiconductor structure along the vertical plane D-D' of FIG. 12A.

Referring to FIGS. 12A, 12B, 12C, 12D, a second exemplary semiconductor structure according to a second embodiment of the present disclosure can be derived from the first exemplary semiconductor structure of FIGS. 2A, 2B, 2C, and 2D by forming a gate structure thereupon. The gate structure is a vertical gate stack including a gate dielectric 52, a gate electrode 54, and a disposable gate cap portion.

The gate structure (52, 54, 55) can be formed, for example, by depositing a gate dielectric layer (not shown), a gate electrode layer (not shown) and a disposable gate cap layer (not shown), and subsequently lithographically patterning the disposable gate cap layer, the gate electrode layer, and the gate dielectric layer. A remaining portion of the gate dielectric layer after the lithographic patterning constitutes the gate dielectric 52, a remaining portion of the gate electrode layer after the lithographic patterning constitutes the gate electrode 54, and a remaining portion of the disposable gate cap layer after the lithographic patterning constitutes the disposable gate cap portion 55.

The gate dielectric 52 can include any gate dielectric material known in the art. In on embodiment, the gate dielectric 52 can include a dielectric metal oxide or a dielectric metal oxynitride, which can be a high dielectric constant (high-k) material having a dielectric constant greater than 7.9.

The gate electrode 54 includes at least one conductive material, which can include a metallic material or a doped semiconductor material. The gate electrode 54 can include a work function metal as known in the art.

The disposable gate cap layer can includes a material that can be employed as a stopping layer for a planarization process to be subsequently employed. For example, the disposable gate cap layer can include silicon nitride, silicon oxide, silicon oxynitride, or a combination thereof. The thickness of the disposable gate cap layer can be from 20 nm to 300 nm, although lesser and greater thicknesses can also be employed.

A photoresist layer (not shown) can be applied over the stack, from bottom to top, of the gate dielectric layer, the gate electrode layer, and the disposable gate cap layer. The photoresist layer can be subsequently patterned into gate patterns, which can include a line that runs perpendicular to, and intersects, the semiconductor fins 30. Physically exposed portions of the disposable gate material layer and the disposable gate cap layer, i.e., portions of the disposable gate material layer and the disposable gate cap layer that are not covered by the patterned photoresist layer, are removed, for example, by an etch, which can be an anisotropic etch. The gate structure (52, 54, 55) straddles middle portions of the semiconductor fins 30.

Optionally, ion implantations such as source/drain extension ion implantations and halo ion implantations can be performed employing the gate structure (52, 54, 55) as a self-aligned implantation mask.

Figure 13A:
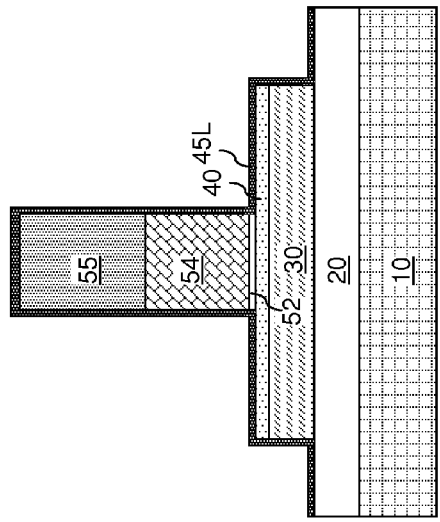
FIG. 13A is a top-down view of the second exemplary semiconductor structure after formation of a dielectric metal compound layer according to the second embodiment of the present disclosure.
Figure 13B:
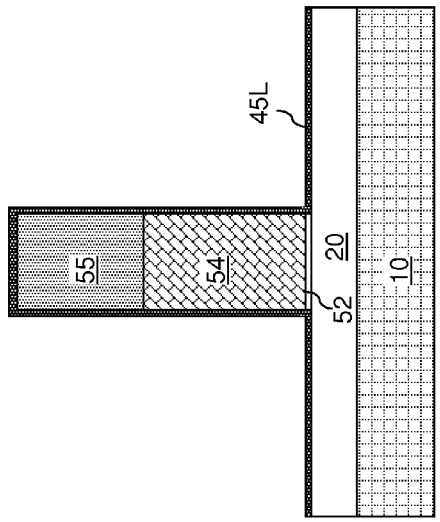
FIG. 13B is a vertical cross-sectional view of the second exemplary semiconductor structure along the vertical plane B-B' of FIG. 13A.
Figure 13C:
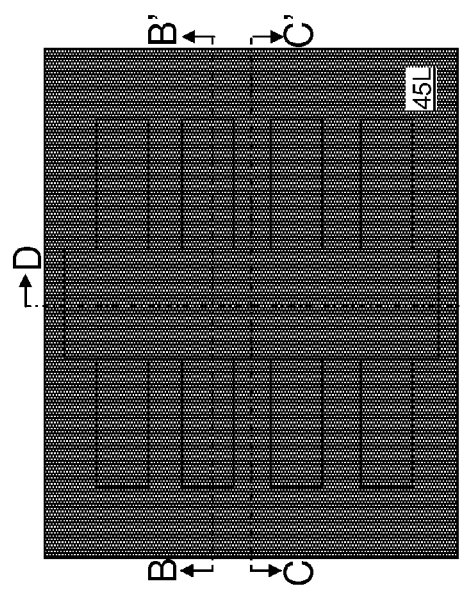
FIG. 13C is a vertical cross-sectional view of the second exemplary semiconductor structure along the vertical plane C-C' of FIG. 13A.
Figure 13D:
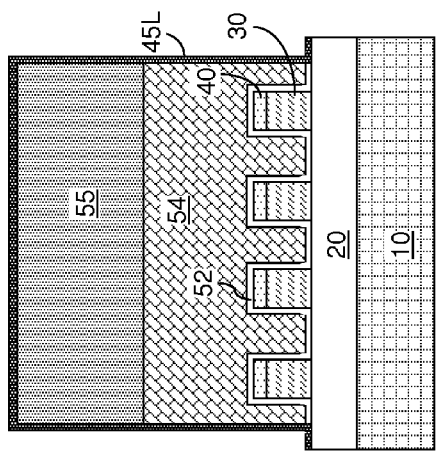
FIG. 13D is a vertical cross-sectional view of the second exemplary semiconductor structure along the vertical plane D-D' of FIG. 13A.

Referring to FIGS. 13A, 13B, 13C, and 13D, a dielectric metal compound liner 45L is deposited directly on surfaces of the semiconductor fins 30 and the optional dielectric fin caps 40 and on physically exposed surfaces of the gate structure (52, 54, 55) as a contiguous material layer. The dielectric metal compound liner 45L includes a dielectric metal compound, i.e., a dielectric material including a metal-containing compound. In one embodiment, the dielectric metal compound liner 45L includes the same dielectric material as in the first embodiment. The thickness of the dielectric metal compound liner 45L can be from 0.6 nm to 10 nm, although lesser and greater thicknesses can also be employed. The dielectric metal compound liner 45L can be deposited employing a same deposition method as in the first embodiment. In one embodiment, the dielectric metal compound liner 45L can be formed as a conformal material layer having a uniform thickness throughout.

Optionally, ion implantations such as source/drain ion implantations can be performed employing the gate structure (52, 54, 55) as a self-aligned implantation mask.

Referring to FIGS. 14A, 14B, 14C, and 14D, a contiguous dielectric material layer 56L is deposited on the top surfaces and sidewall surfaces of the dielectric metal compound liner 45L. Specifically, the contiguous dielectric material layer 56L is deposited on all top surfaces and outer sidewalls surfaces of the dielectric metal compound liner 45. The contiguous dielectric material layer 56L includes a dielectric material such as silicon oxide, silicon nitride, or silicon oxynitride. The contiguous dielectric material layer 56L can be deposited, for example, by chemical vapor deposition (CVD) or atomic layer deposition (ALD). The thickness of the dielectric material layer 56L can be from 3 nm to 100 nm, although lesser and greater thicknesses can also be employed.

Figure 15B:
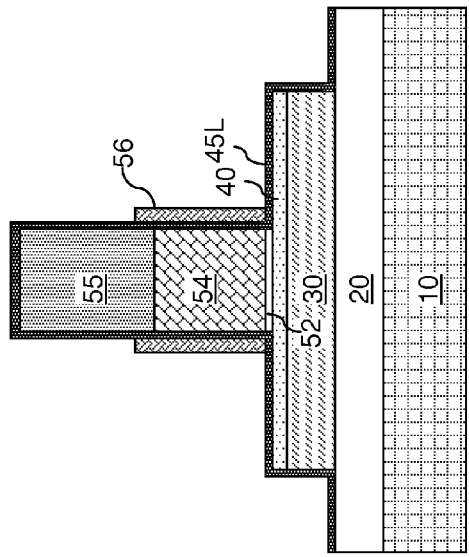
FIG. 15B is a vertical cross-sectional view of the second exemplary semiconductor structure along the vertical plane B-B' of FIG. 15A.
Figure 15C:
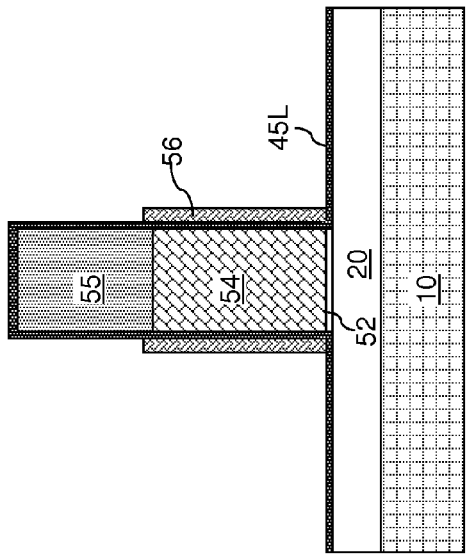
FIG. 15C is a vertical cross-sectional view of the second exemplary semiconductor structure along the vertical plane C-C' of FIG. 15A.
Figure 15A:
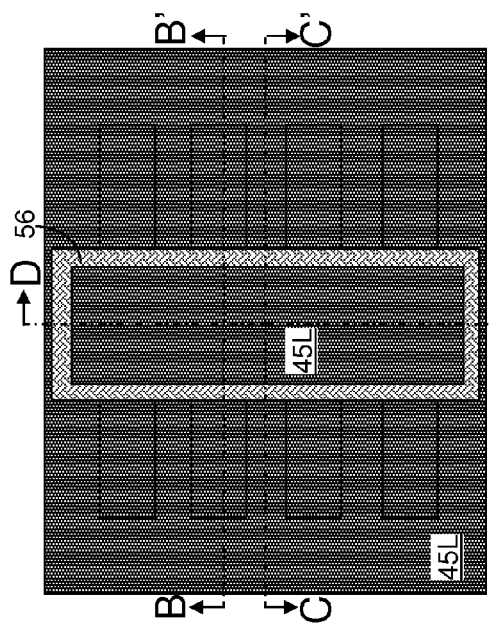
FIG. 15A is a top-down view of the second exemplary semiconductor structure after formation of gate spacers according to the second embodiment of the present disclosure.
Figure 15D:
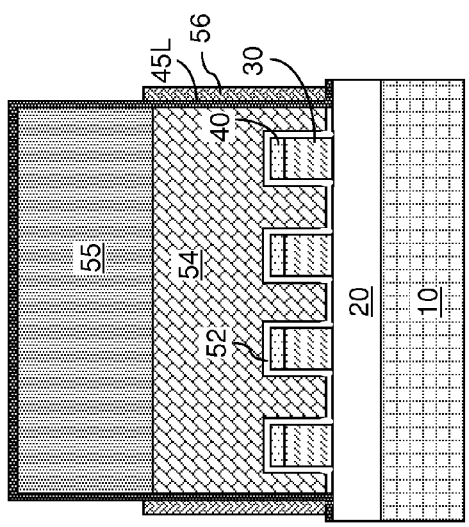
FIG. 15D is a vertical cross-sectional view of the second exemplary semiconductor structure along the vertical plane D-D' of FIG. 15A.

Referring to FIGS. 15A, 15B, 15C, and 15D, an anisotropic etch is performed to removed horizontal portions of the contiguous dielectric material layer 56L and to remove vertical portions of the contiguous dielectric material layer 56L from portions of the sidewalls of the semiconductor fins 30 that laterally protrude from the sidewalls of the gate structure (52, 54, 55) by more than the sum of the thickness of the contiguous dielectric material layer 56L and the thickness of the contiguous dielectric material layer 56L. In other words, the contiguous dielectric material layer 56L is anisotropically etched employing the dielectric metal compound liner 45L as an etch stop layer. A remaining vertical portion of the contiguous dielectric material layer 56L constitutes a gate spacer 56, which is a contiguous dielectric material portion that laterally surrounds the gate structure (52, 54, 55). All bottom surfaces of the gate spacer 56 contacts the dielectric metal compound liner 45L. All inner sidewall surfaces of the gate spacer 56 contacts the dielectric metal compound liner 45L. Thus, the gate spacer 56 is formed directly on the dielectric metal compound liner 45L.

The dielectric metal compound liner 45L protects the semiconductor fins 30 throughout the etch process that forms the gate spacer 56. In order to remove the vertical portions of the contiguous dielectric material layer 56L in regions that are spaced from the gate structure (52, 54, 55) by more than the sum of the thickness of the contiguous dielectric material layer 56L and the thickness of the contiguous dielectric material layer 56L, the material of the contiguous dielectric material layer 56L must be recessed at least by the height of the semiconductor fins 30 (or at least by the sum of the height of the semiconductor fins 30 and the height of the optional dielectric fin caps 40 if the optional dielectric fin caps 40 are present). The etch chemistry of the anisotropic etch is selected such that the dielectric metal compound liner 45L is resistant to the etch chemistry that forms the gate spacer 56. Etch chemistries that remove silicon oxide, silicon nitride, silicon oxynitride selective to a dielectric metal oxide or a dielectric metal oxynitride are known in the art.

Referring to FIGS. 16A, 16B, 16C, and 16D, physically exposed portions of the dielectric metal compound layer 56L are removed selective to the semiconductor material of the semiconductor fins 30. An isotropic etch or an anisotropic etch can be employed. In one embodiment, an isotropic wet etch or an isotropic dry etch that removes a dielectric metal oxide or a dielectric metal oxynitride selective to the semiconductor material of the semiconductor fins 30 can be employed. Etch chemistries that remove a dielectric metal oxide or a dielectric metal oxynitride selective to semiconductor materials are known in the art. In one embodiment, the gate spacer 56 can be used as an etch mask.

The remaining portion of the dielectric metal compound liner 45L underneath the gate spacer 56 constitutes a dielectric metal compound portion 45. In one embodiment, the outer periphery of the dielectric metal compound portion 45 can substantially vertically coincide with the outer periphery of the gate spacer 56. Semiconductor surfaces of the semiconductor fin 30 are physically exposed after removal of the physically exposed portions of the dielectric metal compound liner 45L.

Figure 17A:
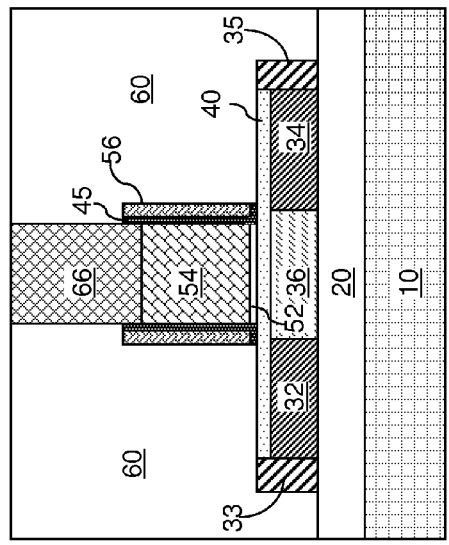
FIG. 17A is a top-down view of the second exemplary semiconductor structure after formation of various contact via structures according to the second embodiment of the present disclosure.
Figure 17B:
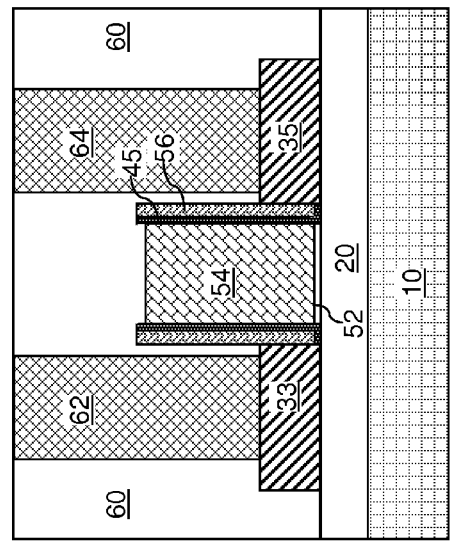
FIG. 17B is a vertical cross-sectional view of the second exemplary semiconductor structure along the vertical plane B-B' of FIG. 17A.
Figure 17C:
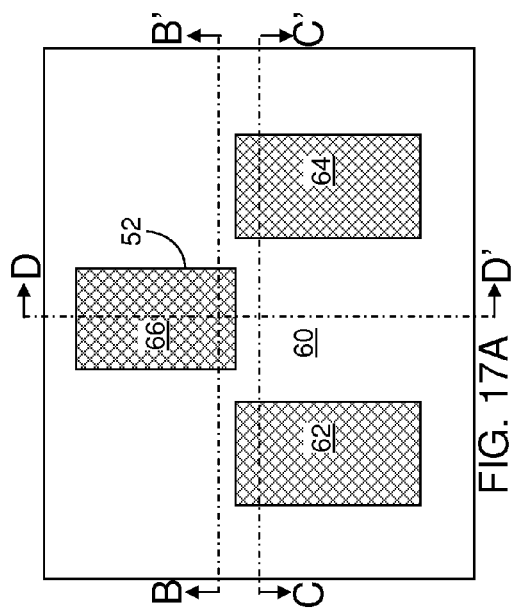
FIG. 17C is a vertical cross-sectional view of the second exemplary semiconductor structure along the vertical plane C-C' of FIG. 17A.
Figure 17D:
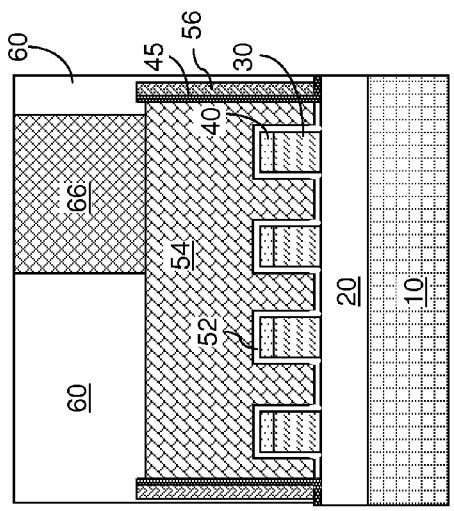
FIG. 17D is a vertical cross-sectional view of the second exemplary semiconductor structure along the vertical plane D-D' of FIG. 17A.

Referring to FIGS. 17A, 17B, 17C, and 17D, a raised source region 33 and a raised drain region 35 can optionally be formed, for example, by selective deposition of a semiconductor material employing the same methods as in the first embodiment. The disposable gate cap portion 55 can be subsequently removed selective to the gate electrode 54 and the semiconductor material of the raised source 33 and the raised drain 35.

A planarization dielectric layer 60 is deposited over the gate electrode and the gate spacer 56, and is subsequently planarized. The planarization dielectric layer 60 can include, for example, silicon oxide, silicon nitride, or porous or non-porous organosilicate glass (OSG). Various contact via structures can be formed through the planarization dielectric layer 60 to provide electrical contact to various elements of the fin field effect transistor. The various contact via structures can include, for example, a source-side contact via structure 62, a drain-side contact via structure 64, and a gate-side contact via structure 66.

The second exemplary semiconductor structure includes at least one semiconductor fin 30 located on the buried insulator layer 20, which is an insulator layer. Further, the second exemplary semiconductor structure includes a gate stack (52, 54) of a gate dielectric 52 and a gate electrode 54. The gate stack (52, 54) straddles a portion of each of the at least one semiconductor fin 30. The second exemplary semiconductor structure further includes the gate spacer 56 laterally surrounding the gate stack (52, 54). Further, the second exemplary semiconductor structure includes the dielectric metal compound portion 45, which contacts a top surface and sidewall surfaces of each of the at least one semiconductor fin 30, at least a portion of sidewalls of the gate stack (52, 54), and a bottom surface of the gate spacer 56.

The dielectric metal compound portion 45 includes a vertical dielectric metal compound sub-portion in contact with the gate stack (52, 54), and a horizontal dielectric metal compound sub-portion that contacts the at lease one semiconductor fin 30 and laterally extending farther from the gate stack (52, 54) than the vertical dielectric metal compound sub-portion.

The vertical dielectric metal compound sub-portion is in contact with all sidewalls of the gate stack (52, 54). The gate spacer 56 is in contact with outer sidewalls of the vertical dielectric metal compound sub-portion. The outer periphery of the gate spacer 56 can be substantially vertically coincident with the outer periphery of the horizontal dielectric metal compound sub-portion. The vertical dielectric metal compound sub-portion is in contact with the gate electrode 54.

The gate dielectric 52 can have a different composition, or a different thickness, than the dielectric metal compound portion 45. In one embodiment, the outer periphery of the dielectric metal compound portion 45 is substantially vertically coincident with the outer periphery of the gate spacer 56.

Figure 18A:
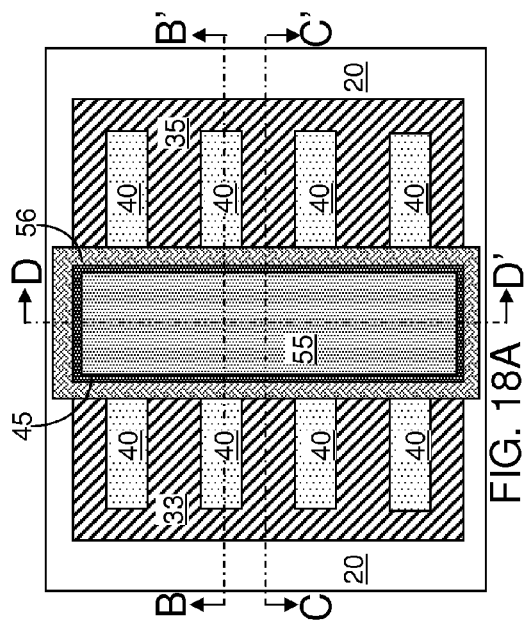
FIG. 18A is a top-down view of a third exemplary semiconductor structure after formation of a disposable gate structure, a dielectric metal compound portion, a gate spacer, a raised source region and a raised drain region according to a third embodiment of the present disclosure.
Figure 18B:
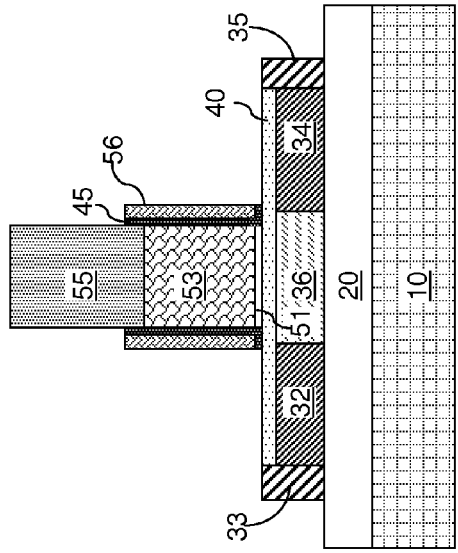
FIG. 18B is a vertical cross-sectional view of the third exemplary semiconductor structure along the vertical plane B-B' of FIG. 18A.
Figure 18C:
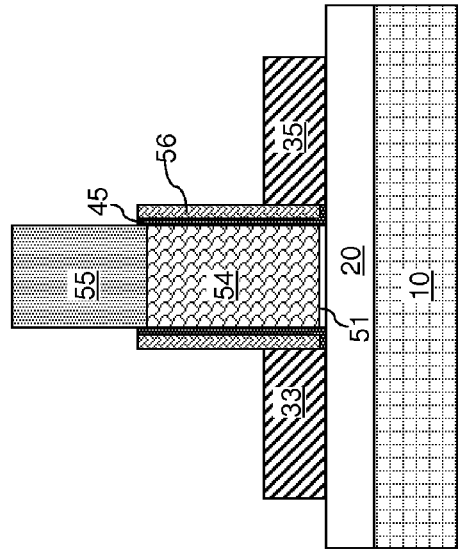
FIG. 18C is a vertical cross-sectional view of the third exemplary semiconductor structure along the vertical plane C-C' of FIG. 18A.
Figure 18D:
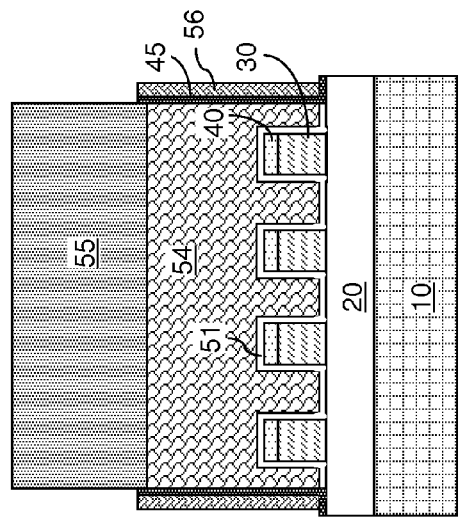
FIG. 18D is a vertical cross-sectional view of the third exemplary semiconductor structure along the vertical plane D-D' of FIG. 18A.

Referring to FIGS. 18A, 18B, 18C, and 18D, a third exemplary semiconductor structure according to a third embodiment of the present disclosure is derived from the second exemplary structure by forming a disposable gate structure instead of a gate structure (52, 54, 55) of the second embodiment. A disposable gate material portion 53 and a disposable gate cap portion 55 in the disposable gate structure (51, 53, 55) of the third embodiment can include the same materials as, and can be formed by the same methods as, the disposable gate structure (53, 55) of the first embodiment. Optionally, the disposable gate structure (51, 53, 55) can include a disposable gate dielectric 51, which can be formed between the disposable gate material portion 53 and the at least one semiconductor fin 30 in order to facilitate the removal of the disposable gate material portion 53 without removing the at least one semiconductor fin 30 in a subsequent processing step. In this case, the processing steps of FIGS. 1A-1D and 2A-2D can be followed by deposition of a disposable gate dielectric layer. The processing steps of FIGS. 4A-4D can be modified to add patterning of the disposable gate dielectric layer to form the disposable gate dielectric 51. Subsequently, the processing steps of FIGS. 13A-13D, 14A-14D, 15A-15D, and 16A-16D can be performed to provide the third exemplary semiconductor structure of FIGS. 18A-18D. The disposable gate dielectric layer can be formed, for example, by deposition of silicon oxide, silicon nitride, or silicon oxynitride. The disposable gate dielectric layer can be deposited, for example, by chemical vapor deposition (CVD), and can have a thickness from 0.6 nm to 6 nm, although lesser and greater thicknesses can also be employed.

Figure 19B:
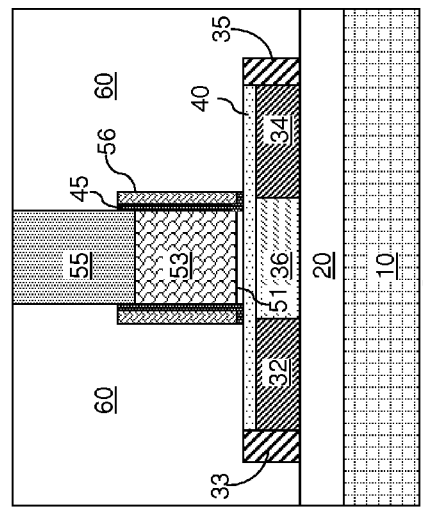
FIG. 19B is a vertical cross-sectional view of the third exemplary semiconductor structure along the vertical plane B-B' of FIG. 19A.
Figure 19C:
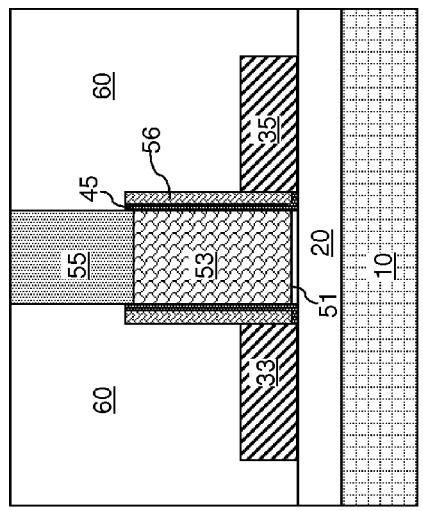
FIG. 19C is a vertical cross-sectional view of the third exemplary semiconductor structure along the vertical plane C-C' of FIG. 19A.
Figure 19A:
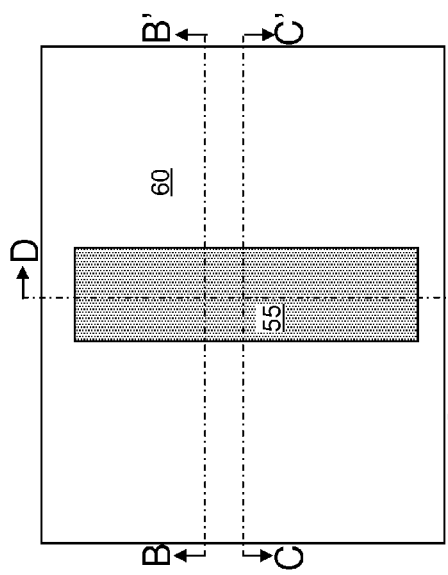
FIG. 19A is a top-down view of the third exemplary semiconductor structure after deposition and planarization of a planarization dielectric layer according to the third embodiment of the present disclosure.
Figure 19D:
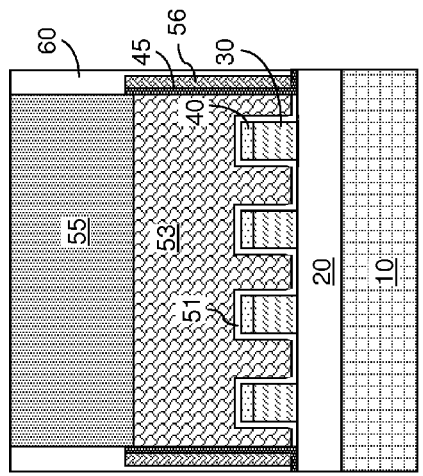
FIG. 19D is a vertical cross-sectional view of the third exemplary semiconductor structure along the vertical plane D-D' of FIG. 19A.

Referring to FIGS. 19A, 19B, 19C, and 19D, the processing steps of FIGS. 9A, 9B, 9C, and 9D can be performed to deposit and planarize a planarization dielectric layer 60.

Referring to FIGS. 20A, 20B, 20C, and 20D, the processing steps of FIGS. 10A, 10B, 10C, and 10D can be performed to form a gate cavity 49 in the planarization dielectric layer 60 by removing the disposable gate structure (51, 53, 55) selective to the planarization dielectric layer 60.

Referring to FIGS. 21A, 21B, 21C, and 21D, the processing steps of FIGS. 11A, 11B, 11C, and 11D can be performed to form a replacement gate structure (52, 54) in the gate cavity 49 and various contact via structures (62, 64) through the planarization dielectric layer 60.

The third exemplary semiconductor structure includes at least one semiconductor fin 30 located on the buried insulator layer 20, which is an insulator layer. Further, the third exemplary semiconductor structure includes a gate stack (52, 54) of a gate dielectric 52 and a gate electrode 54. The gate stack (52, 54) straddles a portion of each of the at least one semiconductor fin 30. The third exemplary semiconductor structure further includes the gate spacer 56 laterally surrounding the gate stack (52, 54). Further, the third exemplary semiconductor structure includes the dielectric metal compound portion 45, which contacts a top surface and sidewall surfaces of each of the at least one semiconductor fin 30, at least a portion of sidewalls of the gate stack (52, 54), and a bottom surface of the gate spacer 56.

The dielectric metal compound portion 45 includes a vertical dielectric metal compound sub-portion in contact with the gate stack (52, 54), and a horizontal dielectric metal compound sub-portion that contacts the at lease one semiconductor fin 30 and laterally extending farther from the gate stack (52, 54) than the vertical dielectric metal compound sub-portion.

The vertical dielectric metal compound sub-portion is in contact with all sidewalls of the gate stack (52, 54). The gate spacer 56 is in contact with outer sidewalls of the vertical dielectric metal compound sub-portion. The outer periphery of the gate spacer 56 can be substantially vertically coincident with the outer periphery of the horizontal dielectric metal compound sub-portion. The vertical dielectric metal compound sub-portion is in contact with the gate electrode 54. The gate dielectric 52 can be a U-shaped gate dielectric contacting all inner sidewalls of the vertical dielectric metal compound sub-portion.

The gate dielectric 52 can have a different composition, or a different thickness, than the dielectric metal compound portion 45. In one embodiment, the outer periphery of the dielectric metal compound portion 45 is substantially vertically coincident with the outer periphery of the gate spacer 56.

Throughout all embodiments of the present disclosure, the dielectric metal compound layer 45L protects the at least one semiconductor fin 30 during the anisotropic etch that removes the vertical portions of the contiguous dielectric material layer 56L to form the gate spacer 56. Thus, erosion of the semiconductor material in the at least one semiconductor fin 30 is minimized through the use of the dielectric metal compound layer 45L.

The method of the present disclosure can also be employed in conjunction with a bulk fin field effect transistor formed on a bulk semiconductor substrate, trigate structures, and/or nanowire structures known in the art. Such variations are expressly contemplated herein.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   a semiconductor fin located on a substrate;
   a gate stack of a U-shaped gate dielectric and a gate electrode, said gate stack straddling a portion of said semiconductor fin, wherein said U-shaped gate dielectric contacts all inner sidewalls of a gate spacer and all inner sidewalls of a dielectric metal compound portion;
   the gate spacer laterally surrounding said gate stack, wherein said gate spacer contacts a portion of a sidewall of said gate stack; and
   the dielectric metal compound portion contacting a top surface and sidewall surfaces of said semiconductor fin, at least a portion of sidewalls of said gate stack, and a bottom surface of said gate spacer.

2. The semiconductor structure of claim 1, wherein said gate dielectric has a different composition, or a different thickness, than said dielectric metal compound portion.

3. A semiconductor structure comprising:
   a semiconductor fin located on a substrate;
   a gate stack of a gate dielectric and a gate electrode, said gate stack straddling a portion of said semiconductor fin;
   a gate spacer laterally surrounding said gate stack, wherein said gate spacer contacts a portion of a sidewall of said gate stack; and
   a dielectric metal compound portion contacting a top surface and sidewall surfaces of said semiconductor fin, at least a portion of sidewalls of said gate stack, and a bottom surface of said gate spacer, wherein an outer periphery of said dielectric metal compound portion is substantially vertically coincident with an outer periphery of said gate spacer, and an inner periphery of said dielectric metal compound portion is substantially vertically coincident with an inner periphery of said gate spacer.

4. A semiconductor structure comprising:
a semiconductor fin located on a substrate;
a gate stack of a gate dielectric and a gate electrode, said gate stack straddling a portion of said semiconductor fin;
a gate spacer laterally surrounding said gate stack; and
a dielectric metal compound portion comprising a vertical dielectric metal compound sub-portion in contact with said gate stack; and a horizontal dielectric metal compound sub-portion that contacts said semiconductor fin and laterally extending farther from said gate stack than said vertical dielectric metal compound sub-portion.

5. The semiconductor structure of claim 4, wherein said vertical dielectric metal compound sub-portion is in contact with all sidewalls of said gate stack.

6. The semiconductor structure of claim 4, wherein said gate spacer is in contact with outer sidewalls of said vertical dielectric metal compound sub-portion.

7. The semiconductor structure of claim 4, wherein an outer periphery of said gate spacer is substantially vertically coincident with an outer periphery of said horizontal dielectric metal compound sub-portion.

8. The semiconductor structure of claim 4, wherein said vertical dielectric metal compound sub-portion is in contact with said gate electrode.

9. The semiconductor structure of claim 4, wherein said gate dielectric is a U-shaped gate dielectric contacting all inner sidewalls of said vertical dielectric metal compound sub-portion.

\* \* \* \* \*